US012224286B2

(12) United States Patent
Vedula et al.

(10) Patent No.: US 12,224,286 B2
(45) Date of Patent: Feb. 11, 2025

(54) SYMMETRIC DUAL-SIDED MOS IC

(71) Applicant: QUALCOMM Incorporated, San Diego, CA (US)

(72) Inventors: Ravi Pramod Kumar Vedula, San Diego, CA (US); Vikram Sekar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 694 days.

(21) Appl. No.: 17/481,618

(22) Filed: Sep. 22, 2021

(65) Prior Publication Data

US 2023/0092546 A1 Mar. 23, 2023

(51) Int. Cl.
*H01L 27/12* (2006.01)
*H01L 23/535* (2006.01)

(52) U.S. Cl.
CPC ........ *H01L 27/1203* (2013.01); *H01L 23/535* (2013.01); *H01L 27/1211* (2013.01)

(58) Field of Classification Search
CPC ............... H01L 27/1203; H01L 23/535; H01L 27/1211; H01L 23/528; H01L 23/481; H01L 23/66; H01L 23/4824
See application file for complete search history.

(56) References Cited

U.S. PATENT DOCUMENTS

| | | | |
|---|---|---|---|
| 9,780,210 B1 | 10/2017 | Goktepeli et al. | |
| 10,410,957 B2 * | 9/2019 | Wang | H01L 27/0207 |
| 10,439,565 B2 | 10/2019 | Goktepeli | |
| 10,886,217 B2 | 1/2021 | Morrow et al. | |
| 10,978,436 B2 * | 4/2021 | Ranta | H01L 21/86 |
| 2014/0361382 A1 * | 12/2014 | Schubert | H01L 23/481 |
| | | | 257/401 |
| 2020/0204175 A1 | 6/2020 | Liang et al. | |
| 2020/0381525 A1 | 12/2020 | Morrow et al. | |

OTHER PUBLICATIONS

International Search Report and Written Opinion—PCT/US2022/042789—ISA/EPO—Feb. 10, 2023.

* cited by examiner

*Primary Examiner* — Karen Kusumakar

(74) *Attorney, Agent, or Firm* — Procopio, Cory, Hargreaves & Savitch LLP

(57) ABSTRACT

A dual-sided MOS IC includes an isolation layer and a MOS transistor. The isolation layer separates the MOS IC into a MOS IC frontside and a MOS IC backside. The MOS transistor is on both the MOS IC frontside and the MOS IC backside. The MOS transistor includes MOS gates, a first source connection in a first subsection of the MOS IC frontside, and a second source connection in a second subsection of the MOS IC backside. The first and second source connections are electrically coupled together through a first front-to-backside connection extending through the isolation layer. The MOS transistor further includes a first drain connection in the first subsection of the MOS IC backside, and a second drain connection in the second subsection of the MOS IC frontside. The first and second drain connections are electrically coupled together through a second front-to-backside connection extending through the isolation layer.

26 Claims, 12 Drawing Sheets

SYMMETRIC DUAL-SIDED MOS IC

TECHNICAL FIELD

The present disclosure relates generally to a layout structure, and more particularly, to a dual-sided metal oxide semiconductor (MOS) integrated circuit (IC) with a symmetric layout.

INTRODUCTION

A radio frequency (RF) switch is a device that routes high frequency signals through transmission paths. A solid state switch is an RF switch provided in an IC. A typical IC includes a stack of sequentially formed layers. Each layer may be stacked or overlaid on a prior layer and patterned to form the shapes that define transistors (e.g., field effect transistors (FETs), fin FETs (FinFETs), gate-all-around (GAA) FETs (GAAFETs), and/or other multigate FETs) and connect the transistors into circuits. Devices may be arranged based on a particular layout structure. There is currently a need for improved layout structures, including improved layout structures for dual-sided MOS IC RF switches.

BRIEF SUMMARY

In an aspect of the disclosure, a dual-sided MOS IC includes an isolation layer extending in a first direction and a second direction and separating the MOS IC into a MOS IC frontside and a MOS IC backside. The MOS IC has a first subsection and a second subsection adjacent to each other in the first direction. The first subsection and the second subsection are separated at an imaginary plane extending in the second direction and a third direction through the MOS IC, where the first direction, the second direction, and the third direction are each orthogonal to each other. The dual-sided MOS IC further includes a MOS transistor on both the MOS IC frontside and the MOS IC backside. The MOS transistor includes a plurality of MOS gates extending in the second direction. The MOS transistor further includes a first source connection extending parallel to the MOS gates and to the isolation layer in the first subsection of the MOS IC frontside. The MOS transistor further includes a second source connection extending parallel to the MOS gates and to the isolation layer in the second subsection of the MOS IC backside. The first and second source connections are electrically coupled together through a first front-to-backside connection extending in the third direction through the isolation layer. The MOS transistor further includes a first drain connection extending parallel to the MOS gates and to the isolation layer in the first subsection of the MOS IC backside. The MOS transistor further includes a second drain connection extending parallel to the MOS gates and to the isolation layer in the second subsection of the MOS IC frontside. The first and second drain connections are electrically coupled together through a second front-to-backside connection extending in the third direction through the isolation layer.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
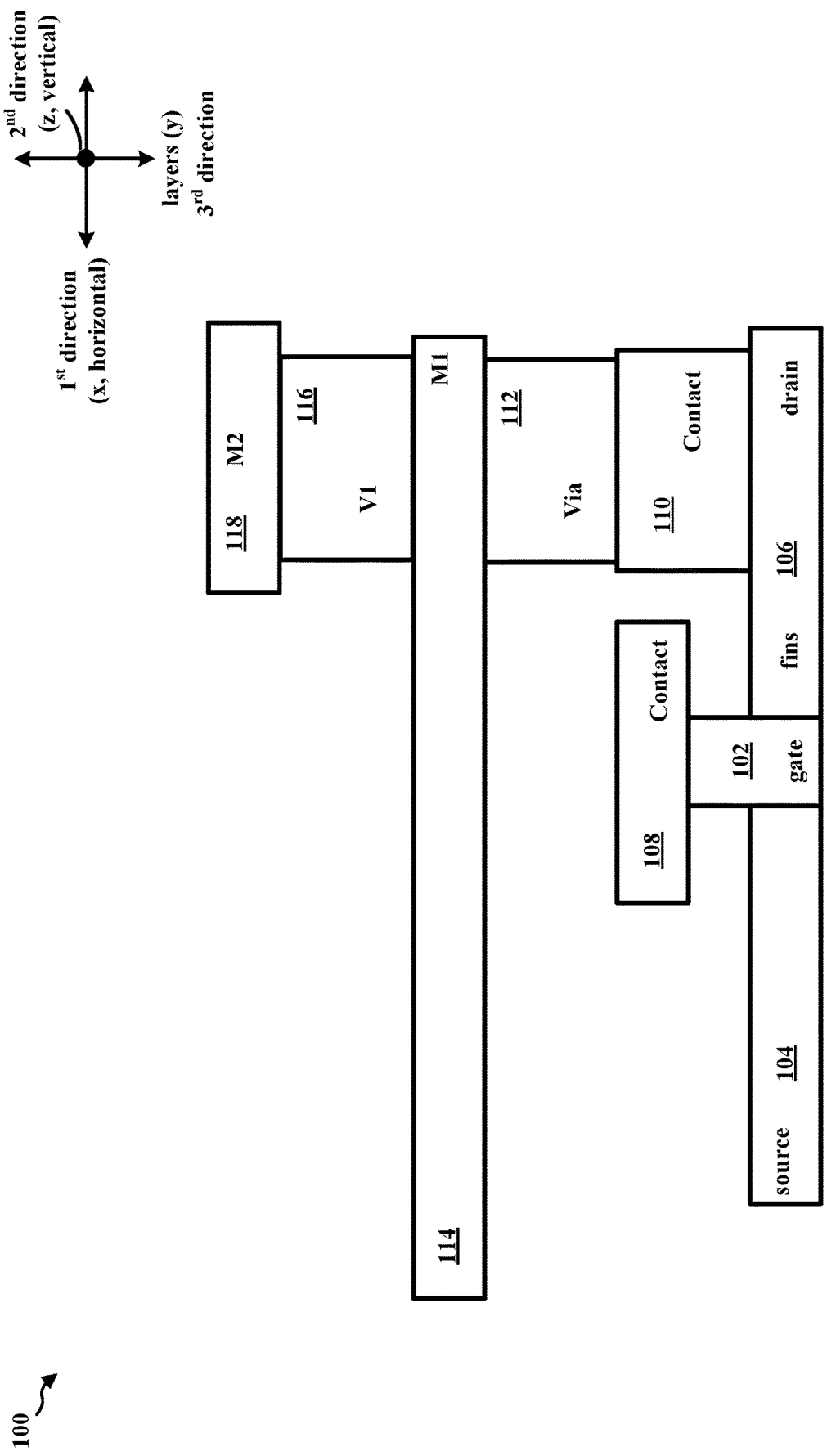
FIG. 1 is a first diagram illustrating a side view of various layers within an IC.

FIG. 1 is a first diagram 100 illustrating a side view of various layers within a cell device and IC. The various layers change in the y direction (labeled as the $3^{rd}$ direction). As illustrated in FIG. 1, a transistor has a gate 102 (which may be referred to as POLY in some instances even though the gate may be formed of metal, polysilicon, or a combination of polysilicon and metal), a source 104, and a drain 106.

The source 104 and the drain 106 may be formed by fins. The gate 102 may extend in a second direction (e.g., vertical direction along the z axis coming out of the page), and the fins may extend in a first direction orthogonal to the second direction (e.g., horizontal direction along the x axis). A contact layer interconnect 108 (also referred to as a metal POLY (MP) layer interconnect, or contact B (CB) layer interconnect) may contact the gate 102. A contact layer interconnect 110 (also referred to as a metal diffusion (MD) layer interconnect, or contact A (CA) layer interconnect) may contact the source 104 and/or the drain 106. A via 112 (also referred to as via A (VA)) may contact the contact layer interconnect 110. A metal 1 ($M_1$) layer interconnect 114 may contact the via 112. The $M_1$ layer interconnect 114 is illustrated as extending in the first direction, but may also extend in the second direction. A via $V_1$ 116 may contact the $M_1$ layer interconnect 114. A metal 2 ($M_2$) layer interconnect 118 may contact the via $V_1$ 116. The $M_2$ layer interconnect 118 is illustrated as extending in the second direction, but may also extend in the first direction. Higher layers include a via layer including vias $V_2$ and an $M_3$ layer including $M_3$ layer interconnects. The $M_3$ layer interconnects may extend in the first and second directions. A cell device may be implemented with FinFETs (as illustrated), GAAFETs, or other multigate FETs. For a continuous oxide diffusion (OD) region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Figure 2:
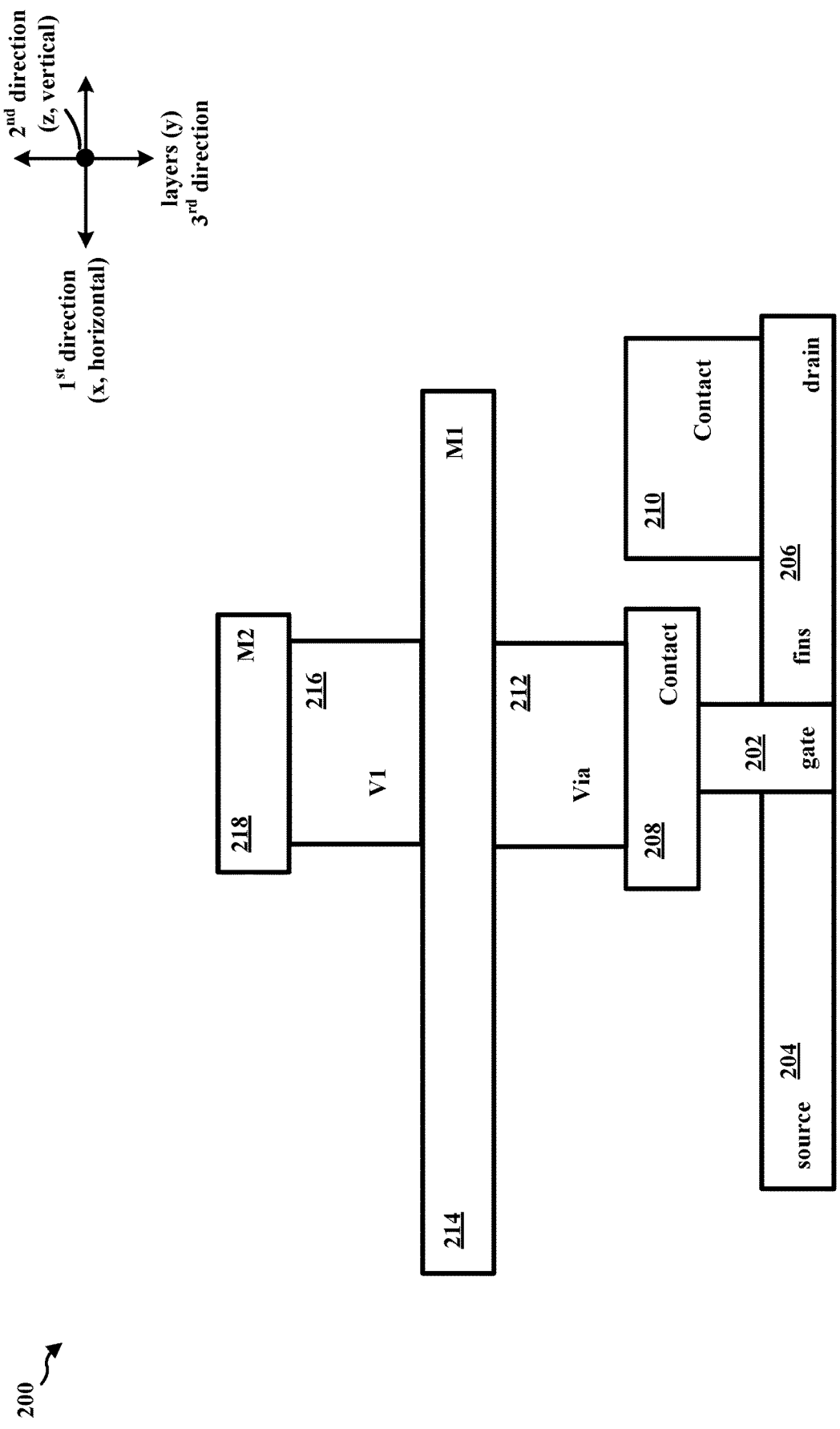
FIG. 2 is a second diagram illustrating a side view of various layers within an IC.

FIG. 2 is a second diagram 200 illustrating a side view of various layers within a standard cell and IC. The various layers change in the y direction (labeled as the $3^{rd}$ direction). As illustrated in FIG. 2, a transistor has a gate 202, a source 204, and a drain 206. The source 204 and the drain 206 may be formed by fins. The gate 202 may extend in a second direction (e.g., vertical direction along the z axis coming out of the page), and the fins may extend in a first direction orthogonal to the second direction (e.g., horizontal direction along the x axis). A contact layer interconnect 208 (also referred to as CB layer interconnect) may contact the gate 202. A contact layer interconnect 210 (also referred to as CA layer interconnect) may contact the source 204 and/or the drain 206. A via 212 (also referred to as via B (VB)) may contact the contact layer interconnect 208. An $M_1$ layer interconnect 214 may contact the via 212. The $M_1$ layer interconnect 214 is illustrated as extending in the first direction, but may also extend in the second direction. A via $V_1$ 216 may contact the $M_1$ layer interconnect 214. An $M_2$ layer interconnect 218 may contact the via V1 216. The $M_2$ layer interconnect 218 is illustrated as extending in the second direction, but may also extend in the first direction. Higher layers include a via layer including vias $V_2$ and an $M_3$ layer including $M_3$ layer interconnects. The $M_3$ layer interconnects may extend in the first and second directions. A cell device may be implemented with FinFETs (as illustrated), GAAFETs, or other multigate FETs. For a continuous OD region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

For MOS IC RF front-end switches, RF switch design requirements may require low impedance loss (IL), including a low on resistance $R_{on}$ (resembling a zero loss metal line, short circuit), where $R_{on}$ contributes to real loss, and a low off capacitance $C_{off}$ which is a power coupling to the ground and contributes to imaginary loss. Components of the capacitance $C_{off}$ include a transistor drain to gate capacitance $C_{dg}$, source to gate capacitance $C_{sg}$, and drain to source capacitance $C_{ds}$. The MOS transistor design on a dual-sided IC with the drain connection on the backside of the dual-sided MOS IC lowers the $C_{ds}$ and the $C_{dg}$, which results in a lower $C_{off}$. A low $C_{off}$ improves the RF switch bandwidth and provides good RF switch isolation (i.e., the RF switch holds off incident power (does not pass signals) when the RF switch is off). RF switch requirements may also require a high breakdown voltage, allowing the RF switch to withstand high voltage swing. An ideal switch may resemble an infinite impedance (open circuit) and may handle any applied power. RF switch requirements may also require low on/off state harmonics (i.e., low nonlinearities). Dual-sided MOS IC RF front-end switches may exhibit higher harmonic distortion due to the asymmetry of the parasitic capacitances $C_{sg}$ and $C_{dg}$, the latter of which is reduced in the dual-sided MOS IC transistor layout. That is, single-sided MOS IC RF front-end switches may exhibit some amount of harmonic distortion, including second-order harmonic distortion (also referred to as second harmonic distortion). However, dual-sided MOS IC RF front-end switches may be subject to a greater amount of second-order harmonic distortion due to parasitic capacitance imbalances in the layout of the dual-sided MOS IC RF front-end switches.

A dual-sided MOS IC layout for a MOS IC RF front-end switch is provided below with respect to FIGS. 3-12 in which the layout has some (reflectional and/or rotational) symmetries that balance the parasitic capacitances in the dual-sided design in order to reduce the second-order harmonics of the dual-sided MOS IC RF front-end switch.

Figure 3:
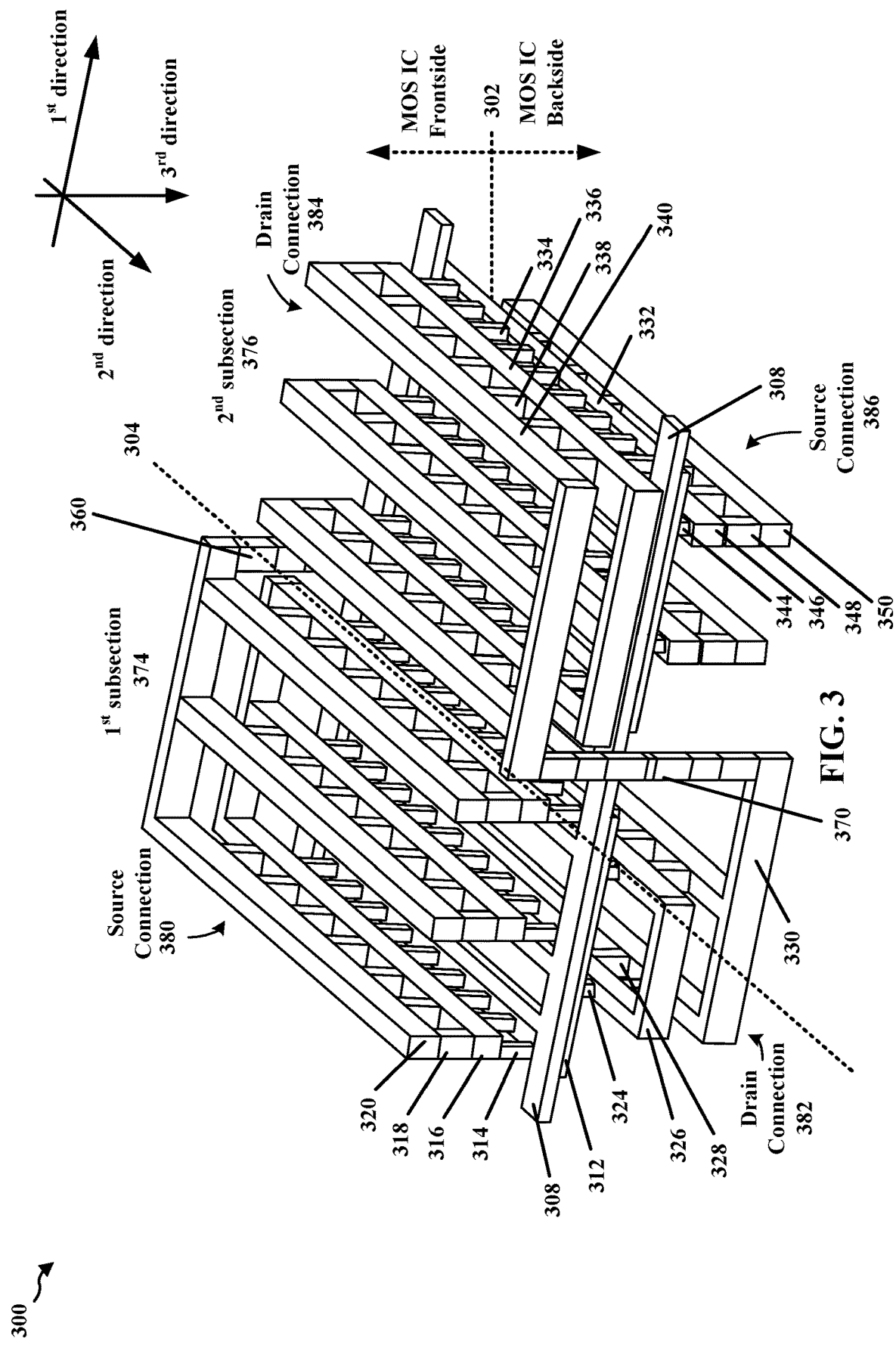
FIG. 3 is a first diagram conceptually illustrating a three-dimensional view of one configuration of a layout structure for the source connections and the drain connections in a dual-sided MOS IC.
Figure 4:
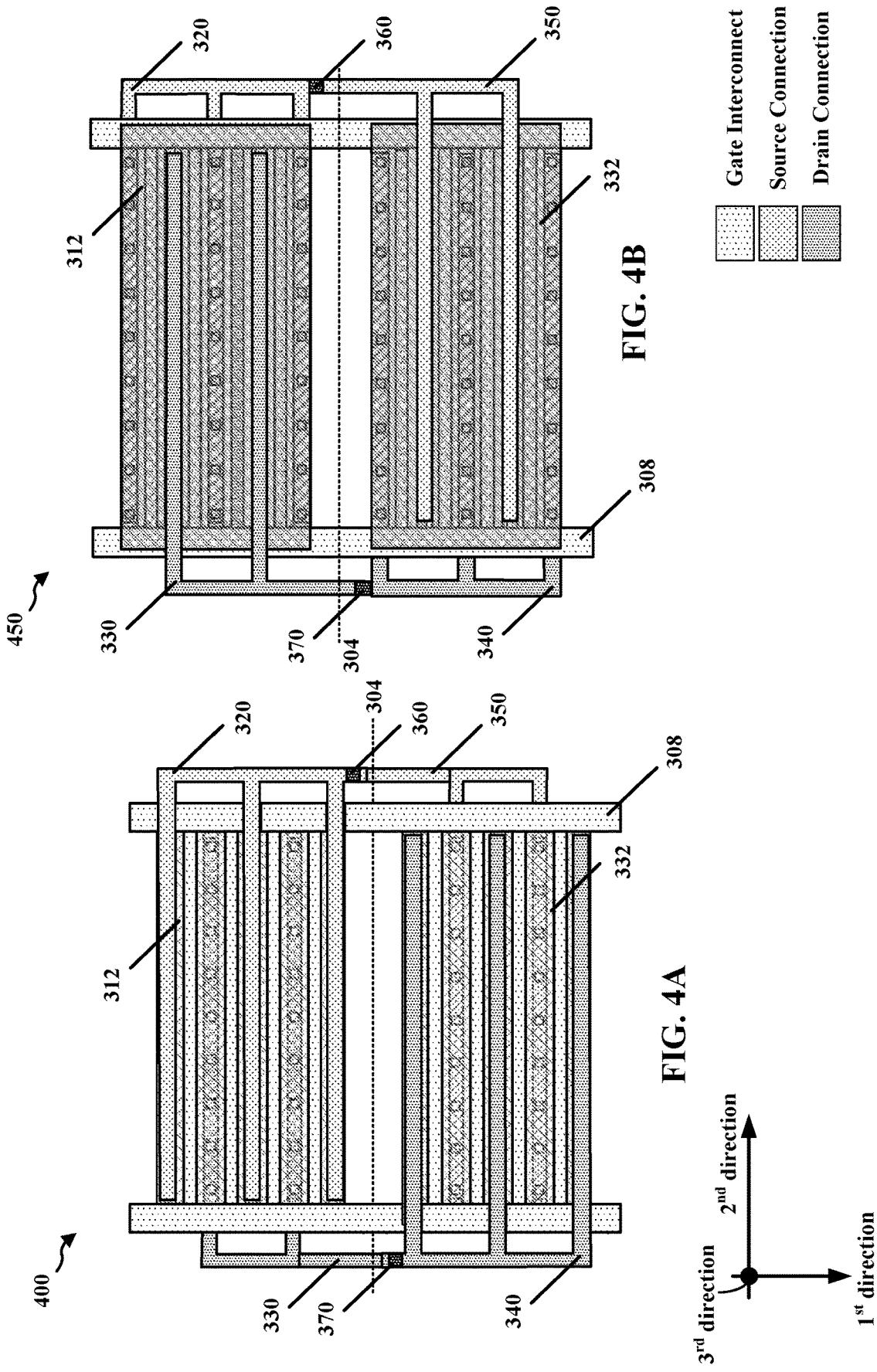
FIG. 4A is a diagram conceptually illustrating a frontside (top) view of the layout structure of FIG. 3.
FIG. 4B is a diagram conceptually illustrating a backside (bottom) view of the layout structure of FIG. 3.

FIG. 3 is a first diagram 300 conceptually illustrating a three-dimensional view of one configuration of a layout structure for the source connections and the drain connections in a dual-sided MOS IC. FIG. 4A is a diagram 400 conceptually illustrating a frontside (top) view of the layout structure of FIG. 3. FIG. 4B is a diagram 450 conceptually illustrating a backside (bottom) view of the layout structure of FIG. 3. The dual-sided MOS IC includes an isolation layer (at approximately 302; see 502 of FIG. 5) that extends in a first direction and a second direction. The isolation layer separates the MOS IC into a MOS IC frontside and a MOS IC backside. The MOS IC has a first subsection 374 and a second subsection 376 adjacent to each other in the first direction. The first subsection 374 and the second subsection 376 are separated at an imaginary plane 304 extending in the second direction and a third direction through the MOS IC, where the first direction, the second direction, and the third direction are each orthogonal to each other. A MOS transistor is on both the MOS IC frontside and the MOS IC backside. The MOS transistor may be an n-type MOS (nMOS) transistor or a p-type MOS (pMOS) transistor. In this example, the MOS transistor is an nMOS transistor. The MOS transistor includes a first diffusion region 312 on the isolation layer of the MOS IC frontside in the first subsection 374, and a second diffusion region 332 on the isolation layer of the MOS IC frontside in the second subsection 376. A plurality of MOS gates 308 on the MOS IC frontside extend in the second direction over the first and second diffusion regions 312, 332. MOS gates may also be referred to as POLY gates or gate interconnects.

In the first subsection 374 on the MOS IC frontside, a first source connection 380 is made to the first diffusion region with a set of contacts/vias 314 (see also 110, 112 of FIG. 1) coupled to the first diffusion region 312, a set of $M_1$ layer interconnects 316 coupled to the set of contacts/vias 314, a set of vias $V_1$ 318 coupled to the set of $M_1$ layer interconnects 316, and a set of $M_2$ layer interconnects 320 coupled to the set of vias $V_1$ 318. The set of contacts/vias 314 contact a first side of the first diffusion region 312 on the MOS IC frontside. Note that while just one of the set of contacts/vias 314 is labeled, the set of contacts/vias 314 includes all of the illustrated contacts/vias that are coupled between the first diffusion region 312 and the set of $M_1$ layer interconnects 316, and that while just one of the set of vias $V_1$ 318 is labeled, the set of vias $V_1$ 318 includes all of the illustrated vias that are coupled between the set of $M_1$ layer interconnects 316 and the set of $M_2$ layer interconnects 320.

The stack of the set of $M_2$ layer interconnects 320, the set of vias $V_1$ 318, the set of $M_1$ layer interconnects 316, and the set of contacts/vias 314 may be referred to as the first source connection 380. The first source connection 380 includes a plurality of fingers extending in the second direction. As illustrated, the first source connection 380 has three fingers extending in the second direction.

In the first subsection 374 on the MOS IC backside, a first drain connection 382 is made to the first diffusion region 312 with a set of contacts/vias 324 (see also 110, 112 of FIG. 1) coupled to the first diffusion region 312 through the isolation layer, a set of backside $M_1$ ($BM_1$) layer interconnects 326 coupled to the set of contacts/vias 324, a set of backside vias $V_1$ ($BV_1$) 328 coupled to the set of $BM_1$ layer interconnects 326, and a set of backside $M_2$ ($3M_2$) layer interconnects 330 coupled to the set of vias $BV_1$ 328. The set of contacts/vias 324 extend from the MOS IC backside, through the isolation layer, to contact a second side of the first diffusion region 312 on the MOS IC frontside. Note that while just one of the set of contacts/vias 324 is labeled, the set of contacts/vias 324 includes all of the illustrated contacts/vias that are coupled between the first diffusion region 312 and the set of $BM_1$ layer interconnects 326, and that while just one of the set of vias $BV_1$ 328 is labeled, the set of vias $BV_1$ 328 includes all of the illustrated vias that are coupled between the set of $BM_1$ layer interconnects 326 and the set of $BM_2$ layer interconnects 330.

The stack of the set of $BM_2$ layer interconnects 330, the set of vias $BV_1$ 328, the set of $BM_1$ layer interconnects 326, and the set of contacts/vias 324 may be referred to as the first drain connection 382. The first drain connection 382 includes a plurality of fingers extending in the second direction. As illustrated, the first drain connection 382 has two fingers extending in the second direction.

In the second subsection 376 on the MOS IC frontside, a second drain connection 384 is made to the second diffusion region 332 with a set of contacts/vias 334 (see also 110, 112 of FIG. 1) coupled to the second diffusion region 332, a set of $M_1$ layer interconnects 336 coupled to the set of contacts/vias 334, a set of vias $V_1$ 338 coupled to the set of $M_1$ layer interconnects 336, and a set of $M_2$ layer interconnects 340 coupled to the set of vias $V_1$ 338. The set of contacts/vias 334 contact a first side of the second diffusion region 332 on the MOS IC frontside. Note that while just one of the set of contacts/vias 334 is labeled, the set of contacts/vias 334 includes all of the illustrated contacts/vias that are coupled between the second diffusion region 332 and the set of $M_1$ layer interconnects 336, and that while just one of the set of vias $V_1$ 338 is labeled, the set of vias $V_1$ 338 includes all of the illustrated vias that are coupled between the set of $M_1$ layer interconnects 336 and the set of $M_2$ layer interconnects 340.

The stack of the set of $M_2$ layer interconnects 340, the set of vias $V_1$ 338, the set of $M_1$ layer interconnects 336, and the set of contacts/vias 334 may be referred to as the second drain connection 384. The second drain connection 384 includes a plurality of fingers extending in the second direction. As illustrated, the second drain connection 384 has three fingers extending in the second direction on the MOS IC frontside.

In the second subsection 376 on the MOS IC backside, a second source connection 386 is made to the second diffusion region 332 with a set of contacts/vias 344 (see also 110, 112 of FIG. 1) coupled to the second diffusion region 332 through the isolation layer, a set of $BM_1$ layer interconnects 346 coupled to the set of contacts/vias 344, a set of vias $BV_1$ 348 coupled to the set of $BM_1$ layer interconnects 346, and a set of $BM_2$ layer interconnects 350 coupled to the set of vias $BV_1$ 348. The set of contacts/vias 344 extend from the MOS IC backside, through the isolation layer, to contact a second side of the second diffusion region 332 on the MOS IC frontside. Note that while just one of the set of contacts/vias 344 is labeled, the set of contacts/vias 344 includes all of the illustrated contacts/vias that are coupled between the second diffusion region 332 and the set of $BM_1$ layer interconnects 346, and that while just one of the set of vias $BV_1$ 348 is labeled, the set of vias $BV_1$ 348 includes all of the illustrated vias that are coupled between the set of $BM_1$ layer interconnects 346 and the set of $BM_2$ layer interconnects 350.

The stack of the set of $BM_2$ layer interconnects 350, the set of vias $BV_1$ 348, the set of $BM_1$ layer interconnects 346, and the set of contacts/vias 344 may be referred to as the second source connection 386. The second source connection 386 includes a plurality of fingers extending in the second direction. As illustrated, the second source connection 386 has two fingers extending in the second direction.

As discussed above, the source connection 380 contacts a first side of the diffusion region 312, the drain connection 382 contacts a second side of the diffusion region 312, the drain connection 384 contacts a first side of the diffusion region 332 and the source connection 386 contacts a second side of the diffusion region 332. Specifically, the source connection 380 is coupled to a first source diffusion region (first side of the diffusion region) 312 on the MOS IC frontside, the drain connection 382 is coupled to a first drain diffusion region (second side of the diffusion region) 312 on the MOS IC backside, the drain connection 384 is coupled to a second drain diffusion region (first side of the diffusion region) 332 on the MOS IC frontside, and the second source connection 386 is coupled to a second source diffusion region (second side of the diffusion region) 332 on the MOS IC backside. The first source diffusion region (first side of the diffusion region) 312 and the first drain diffusion region (second side of the diffusion region) 312 share a first continuous diffusion region, and the second source diffusion region (second side of the diffusion region) 332 and the second drain diffusion region (first side of the diffusion region) 332 share a second continuous diffusion region, where the first continuous diffusion region and the second continuous diffusion region are separate from each other. As illustrated in FIG. 3, the diffusion regions 312, 332 are separate from each other.

The first source connection 380 and the second source connection 386 are electrically coupled together through a first front-to-backside connection 360 extending in the third direction through the isolation layer. Specifically, the set of $M_2$ layer interconnects 320 is coupled to the set of $BM_2$ layer interconnects 350 through the first front-to-backside connection 360 extending in the third direction through the isolation layer. The first drain connection 382 and the second drain connection 384 are electrically coupled together through a second front-to-backside connection 370 extending in the third direction through the isolation layer. Specifically, the set of $M_2$ layer interconnects 340 is coupled to the set of $BM_2$ layer interconnects 330 through the second front-to-backside connection 370 extending in the third direction through the isolation layer.

The first and second front-to-backside connections 360, 370 include one or more vias that extend in the third direction through the isolation layer. The first and second front-to-backside connections 360, 370 may be offset from the imaginary plane 304, as illustrated in FIGS. 4A, 4B, or may be approximately aligned with the imaginary plane 304. Whether offset or approximately aligned, the first and second front-to-backside connections 360, 370 may be approximately symmetric (e.g., 180° rotation about an axis in the $3^{rd}$ direction at the imaginary plane 304) to each other with respect to the imaginary plane 304.

As can be seen in FIGS. 3, 4A, 4B, the first source connection 380 and the second drain connection 384 are approximately symmetric through rotation and reflection to each other with respect to the imaginary plane 304, and the first drain connection 382 and the second source connection 386 are approximately symmetric through rotation and reflection to each other with respect to the imaginary plane 304. Specifically, the fingers of each of the source/drain connections have a reflectional symmetry, and the source/drain connection stacks 380, 382, 384, 386 have a rotational symmetry (e.g., 180° rotation about an axis in the $3^{rd}$ direction at the imaginary plane 304). The symmetric layout of the source/drain connections 380, 382, 384, 386 and the front-to-backside connections 360, 370 balance the parasitic capacitances in the dual-sided transistor layout, resulting in a reduction in the second-order harmonics of the dual-sided MOS IC RF front-end switch.

Figure 5:
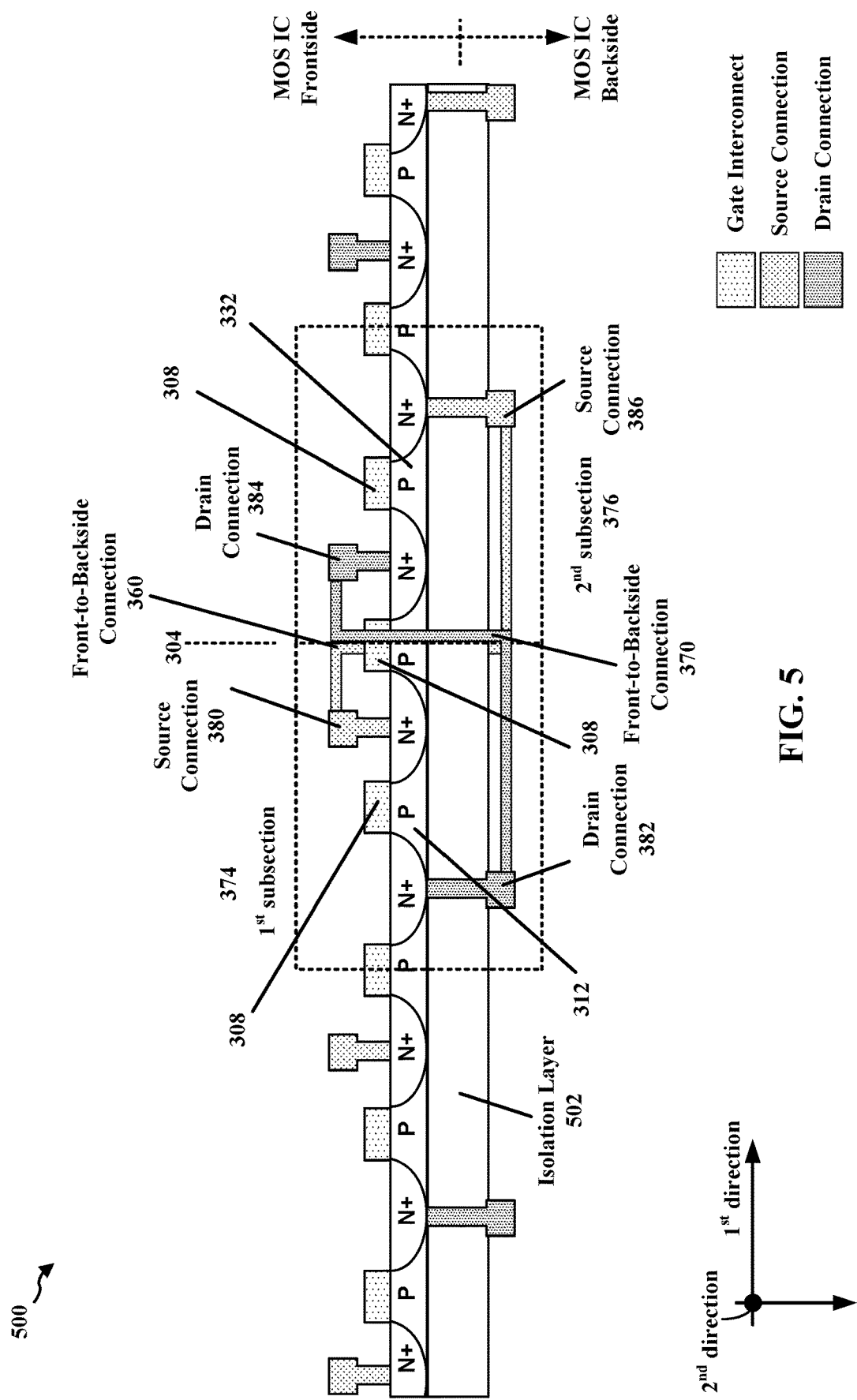
FIG. 5 is a second diagram conceptually illustrating a side-view of a dual-sided MOS IC.

FIG. 5 is a second diagram 500 conceptually illustrating a side-view of a dual-sided MOS IC. The diagram 500 is conceptual, and does not represent an exact layout of the dual-sided MOS IC. As illustrated in FIG. 5, the MOS IC includes an isolation layer 502 extending in a first direction and a second direction. The isolation layer 502 may be a buried oxide (BOX) layer. The isolation layer 502 separates the MOS IC into a MOS IC frontside and a MOS IC backside. The MOS IC has a first subsection 374 and a second subsection 376 adjacent to each other in the first direction. The first subsection 374 and the second subsection 376 are separated at an imaginary plane 304 extending in the second direction and a third direction through the MOS IC, where the first direction, the second direction, and the third direction are each orthogonal to each other. The MOS IC further includes a MOS transistor on both the MOS IC frontside and the MOS IC backside. The MOS transistor has a plurality of MOS gates 308 that are coupled together and extend in the second direction over a first diffusion region 312 and a second diffusion region 332. In the first subsection 374, a source connection 380 is on the MOS IC frontside and a drain connection 382 is on the MOS IC backside. The drain connection 382 extends through the isolation layer 502 to contact one side of the first diffusion region 312. The source connection 380 is coupled to a first side of the first diffusion region 312, and the drain connection 382 is coupled to a second side of the first diffusion region 312. In the second subsection 376, a drain connection 384 is on the MOS IC frontside and a source connection 386 is on the MOS IC backside. The source connection 386 extends through the isolation layer 502 to contact one side of the second diffusion region 332. The drain connection 384 is coupled to a first side of the second diffusion region 332, and the source connection 386 is coupled to a second side of the second diffusion region 332. Although not shown in FIG. 5, a diffusion break separates the diffusion regions 312, 332 from each other (see FIG. 3, which shows a break in the diffusion regions 312, 332). The source connections 380, 386 are electrically coupled together through a front-to-backside connection 360 extending in the third direction through the isolation layer 502. The drain connections 382, 384 are electrically coupled together through a front-to-backside connection 370 extending in the third direction through the isolation layer 502. The front-to-backside connections 360, 370 may be rotationally symmetric, as discussed above, with respect to the imaginary plane 304.

Figure 6:
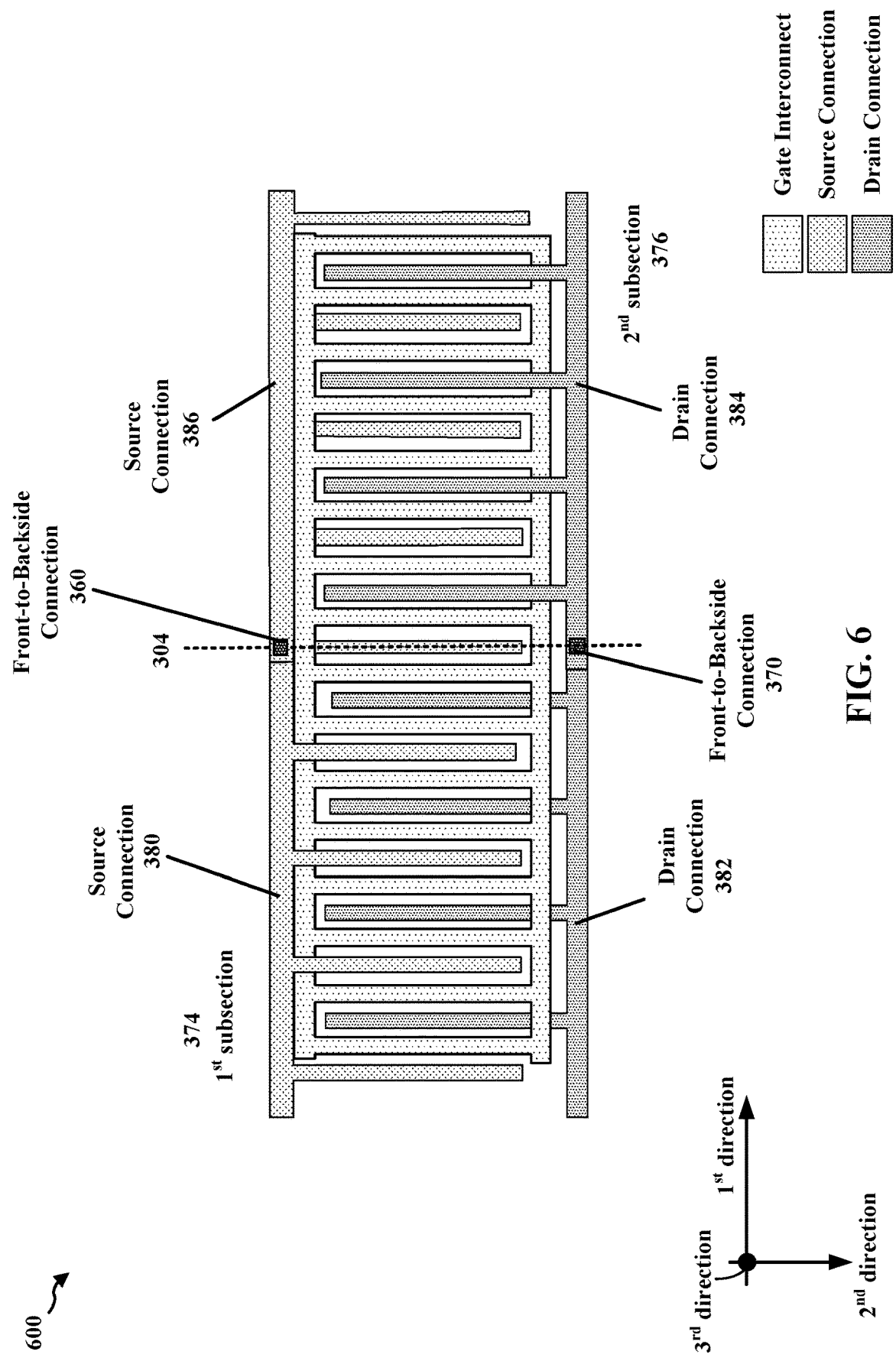
FIG. 6 is a third diagram conceptually illustrating a frontside (top) view of one configuration of the source connections and the drain connections in a dual-sided MOS IC.

FIG. 6 is a third diagram 600 conceptually illustrating a frontside (top) view of one configuration of the source connections and the drain connections in a dual-sided MOS IC. In one configuration, the MOS transistor may have N transistor fingers (i.e., source connection stack and drain connection stack fingers). The MOS transistor may be split into K subsections with M fingers per subsection. Accordingly, N/M=K. In one configuration, K may be an even number. Such an arrangement would provide for K−1 imaginary planes of symmetry, and K−1 front-to-backside connections. Each adjacent subsection may have the source/drain connection stack alternating on the MOS IC frontside and the MOS IC backside, with a pair of front-to-backside connections electrically connecting the corresponding connection stacks. As illustrated in FIG. 6, N=16, providing the MOS transistor with 16 fingers, and K=2 with one imaginary plane, providing two subsections, with M=8 fingers per subsection.

The source connection 380 in the first subsection 374 is on a MOS IC frontside, and the source connection 386 in the second subsection 376 is on a MOS IC backside. The source connections 380, 386 are connected together through the front-to-backside connection 360. In addition, the drain connection 382 in the first subsection 374 is on a MOS IC backside, and the drain connection 384 in the second subsection 376 is on a MOS IC frontside. The drain connections 382, 384 are connected together through the front-to-backside connection 370. As can be seen in FIG. 6, the transistor fingers have a reflectional symmetry about the imaginary plane 304, the source/drain connection stacks 380, 382, 384, 386 have a rotational symmetry about the imaginary plane 304, and the front-to-backside connections have a rotational symmetry about the imaginary plane 304. As discussed above, the symmetric layout of the source/drain connections 380, 382, 384, 386 and the front-to-backside connections 360, 370 balance the parasitic capacitances in the dual-sided transistor layout, resulting in a reduction in the second-order harmonics of the dual-sided MOS IC RF front-end switch.

Figure 7:
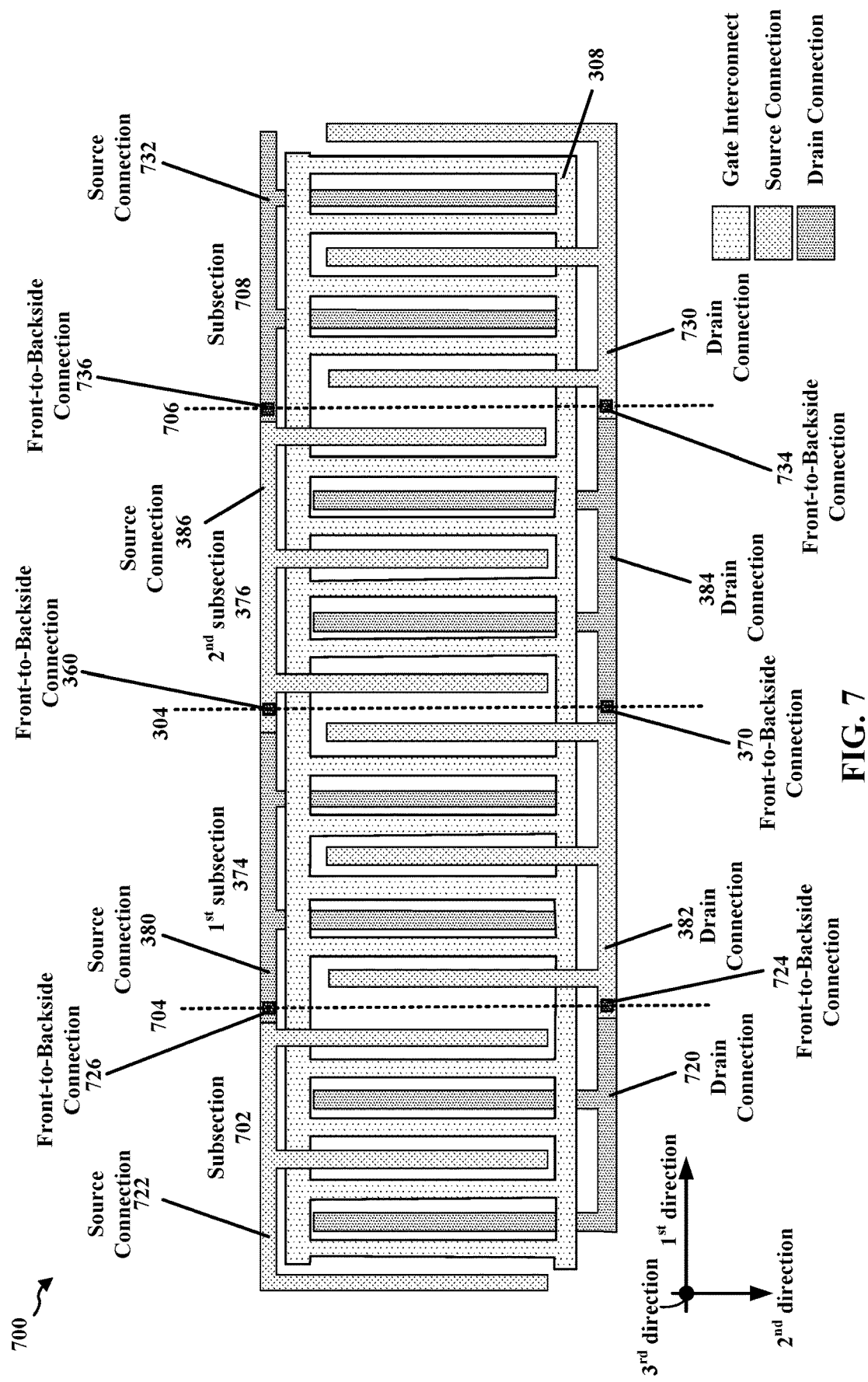
FIG. 7 is a fourth diagram conceptually illustrating a frontside (top) view of one configuration of the source connections and the drain connections in a dual-sided MOS IC.

FIG. 7 is a fourth diagram 700 conceptually illustrating a frontside (top) view of one configuration of the source connections and the drain connections in a dual-sided MOS IC. As illustrated in FIG. 7, N=16, providing the MOS transistor with 16 fingers, and K=4 with three imaginary planes of symmetry (rotational and/or reflection), providing four subsections, with M=2 fingers per subsection. There are three pairs of front-to-backside connections electrically connecting adjacent connection stacks.

The source connection 380 in the first subsection 374 is on a MOS IC frontside, and the source connection 386 in the second subsection 376 is on a MOS IC backside. The source connections 380, 386 are connected together through the front-to-backside connection 360. In addition, the drain connection 382 in the first subsection 374 is on a MOS IC backside, and the drain connection 384 in the second subsection 376 is on a MOS IC frontside. The drain connections 382, 384 are electrically connected together through the front-to-backside connection 370.

The MOS IC has a subsection 702 adjacent to the first subsection 374 in the first direction. The first subsection 374 and the subsection 702 are separated at an imaginary plane 704 extending in the second direction and the third direction through the MOS IC. The MOS transistor further includes a drain connection 720 extending parallel to the MOS gates 308 and to the isolation layer in the subsection 702 of the MOS IC frontside. The drain connections 720, 382 are electrically coupled together through a front-to-backside connection 724 extending in the third direction through the isolation layer. The MOS transistor further includes a source connection 722 extending parallel to the MOS gates 308 and to the isolation layer in the subsection 702 of the MOS IC backside. The source connections 722, 380 are electrically coupled together through a front-to-backside connection 726 extending in the third direction through the isolation layer.

The source connection 380 and the drain connection 720 may be approximately symmetric (i.e., through rotation and/or reflection) to each other with respect to the imaginary plane 704, the drain connection 382 and the source connection 722 may be approximately symmetric (i.e., through rotation and/or reflection) to each other with respect to the imaginary plane 704, and the front-to-backside connections 724, 726 may be approximately symmetric (i.e., through rotation) to each other with respect to the imaginary plane 704.

The MOS IC has a subsection 708 adjacent to the second subsection 376 in the first direction. The second subsection 376 and the subsection 708 are separated at an imaginary plane 706 extending in the second direction and the third direction through the MOS IC. The MOS transistor further includes a source connection 732 extending parallel to the MOS gates 308 and to the isolation layer in the subsection 708 of the MOS IC frontside. The source connections 386, 732 are electrically coupled together through a front-to-backside connection 736 extending in the third direction through the isolation layer. The MOS transistor further includes a drain connection 730 extending parallel to the MOS gates 308 and to the isolation layer in the subsection 708 of the MOS IC backside. The drain connections 384, 730 are electrically coupled together through a front-to-backside connection 734 extending in the third direction through the isolation layer.

The source connection 386 and the drain connection 730 may be approximately symmetric (i.e., through rotation and/or reflection) to each other with respect to the imaginary plane 706, the drain connection 384 and the source connection 732 may be approximately symmetric (i.e., through rotation and/or reflection) to each other with respect to the imaginary plane 706, and the front-to-backside connections 734, 736 may be approximately symmetric (i.e., through rotation) to each other with respect to the imaginary plane 706.

Referring again to FIG. 7, a dual-sided MOS IC includes an isolation layer (see 502 of FIG. 5) extending in a first direction and a second direction and separating the MOS IC into a MOS IC frontside and a MOS IC backside. The MOS IC has a first subsection 374 and a second subsection 376 adjacent to each other in the first direction. The first subsection 374 and the second subsection 376 are separated at an imaginary plane 304 extending in the second direction and a third direction through the MOS IC, where the first direction, the second direction, and the third direction are each orthogonal to each other. A MOS transistor is on both the MOS IC frontside and the MOS IC backside. The MOS transistor includes a plurality of MOS gates 308 extending in the second direction. The MOS transistor further includes a first source connection 380 extending parallel to the MOS gates and to the isolation layer in the first subsection 374 of the MOS IC frontside. The MOS transistor further includes a second source connection 386 extending parallel to the MOS gates and to the isolation layer in the second subsection 376 of the MOS IC backside. The first and second source connections 380, 386 are electrically coupled together through a first front-to-backside connection 360 extending in the third direction through the isolation layer. The MOS transistor further includes a first drain connection 382 extending parallel to the MOS gates and to the isolation layer in the first subsection 374 of the MOS IC backside. The MOS transistor further includes a second drain connection 384 extending parallel to the MOS gates and to the isolation layer in the second subsection 376 of the MOS IC frontside. The first and second drain connections 382, 384 are electrically coupled together through a second front-to-backside connection 370 extending in the third direction through the isolation layer.

As illustrated in FIG. 7, in a first configuration, the MOS IC may have a third subsection 702 to the left of the first subsection 374 and the second subsection 376, where the third subsection 702 has a drain connection 720 on the MOS IC frontside and a source connection 722 on the MOS IC backside. Specifically, the MOS IC may have a third subsection 702 adjacent to the first subsection in the first direction. The first subsection 374 and the third subsection 702 are separated at a second imaginary plane 704 extending in the second direction and the third direction through the MOS IC. The MOS transistor further includes a third drain connection 720 extending parallel to the MOS gates and to the isolation layer in the third subsection 702 of the MOS IC frontside. The first and third drain connections 382, 720 are electrically coupled together through a third front-to-backside connection 724 extending in the third direction through the isolation layer. The MOS transistor further includes a third source connection 722 extending parallel to the MOS gates and to the isolation layer in the third subsection 702 of the MOS IC backside. The first and third source connections 380, 722 are electrically coupled together through a fourth front-to-backside connection 726 extending in the third direction through the isolation layer. The first source connection 380 and the third drain connection 720 are approximately symmetric (through rotation and/or reflection) to each other with respect to the second imaginary plane 704, and the first drain connection 382 and the third source connection 722 are approximately symmetric (through rotation and/or reflection) to each other with respect to the second imaginary plane 704.

As illustrated in FIG. 7, in a second configuration, the MOS IC may have a third subsection 708 to the right of the first subsection 374 and the second subsection 376, where the third subsection 708 has a drain connection 730 on the MOS IC backside and a source connection 732 on the MOS IC frontside. Specifically, the MOS IC may have a third subsection 708 adjacent to the second subsection 376 in the first direction. The second subsection 376 and the third subsection 708 may be separated at a second imaginary plane 706 extending in the second direction and the third direction through the MOS IC. The MOS transistor may further include a third source connection 732 extending parallel to the MOS gates and to the isolation layer in the third subsection 708 of the MOS IC frontside. The second and third source connections 386, 732 are electrically coupled together through a third front-to-backside connection 736 extending in the third direction through the isolation layer. The MOS transistor further includes a third drain connection 730 extending parallel to the MOS gates and to the isolation layer in the third subsection 708 of the MOS IC backside. The second and third drain connections 384, 730 are electrically coupled together through a fourth front-to-backside connection 734 extending in the third direction through the isolation layer. The second source connection 386 and the third drain connection 730 are approximately symmetric (through rotation and/or reflection) to each other with respect to the second imaginary plane 706. The second drain connection 384 and the third source connection 732 are approximately symmetric (through rotation and/or reflection) to each other with respect to the second imaginary plane 706.

As illustrated in FIG. 7, in a third configuration, the MOS IC may include four subsections, including the subsections 702, 374, 376, 708. In such a configuration, there are three imaginary planes of symmetry 704, 304, 706.

As discussed above, the symmetric layout of the source/drain connections 720, 380; 722, 382; 380, 384; 382, 386; 386, 730; and 384, 732 and the front-to-backside connections 360, 370; 724, 726; and 734, 736 balance the parasitic capacitances in the dual-sided transistor layout, resulting in a reduction in the second-order harmonics of the dual-sided MOS IC RF front-end switch.

Figure 8:
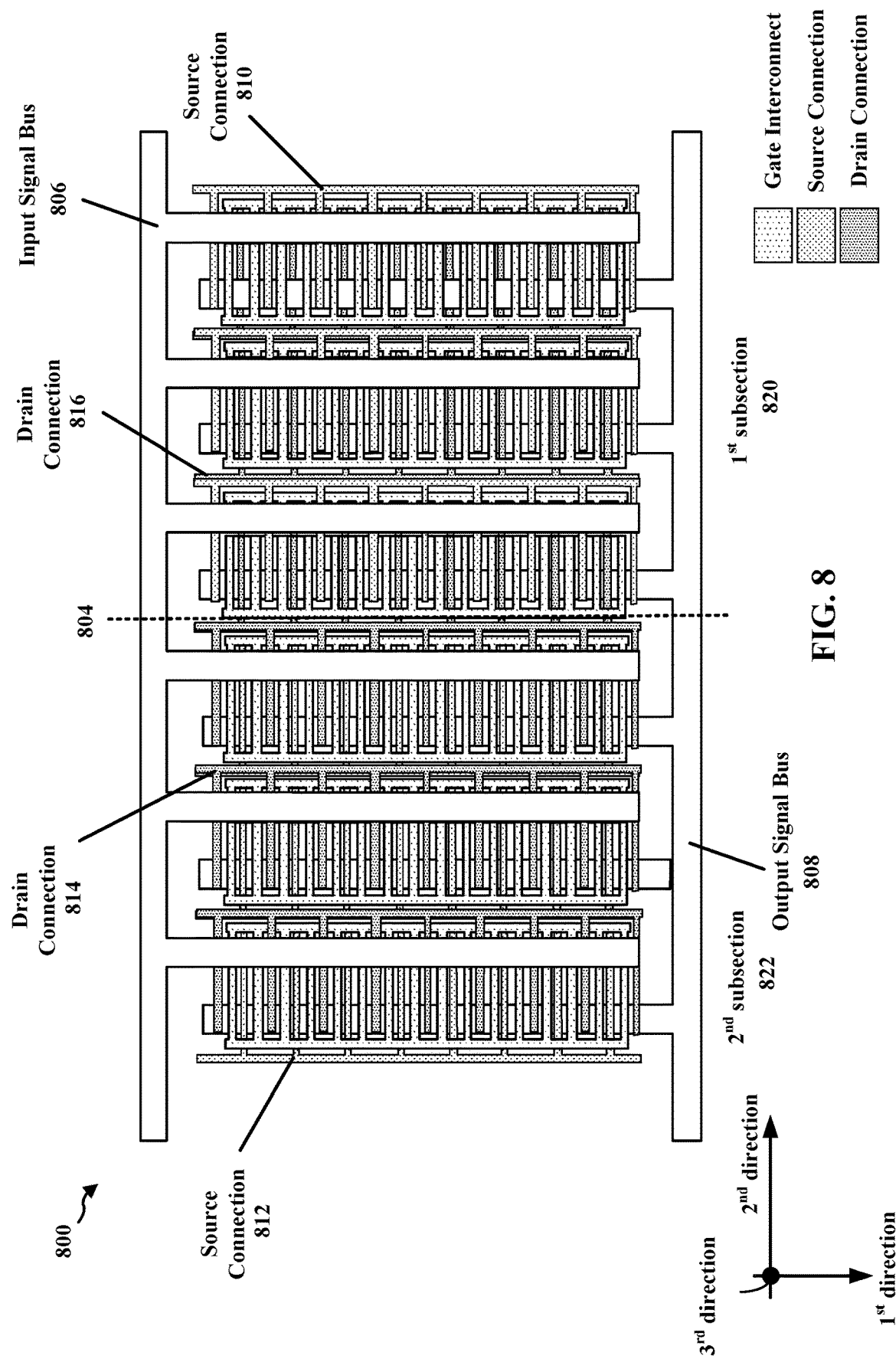
FIG. 8 is a first diagram conceptually illustrating a frontside (top) view of one configuration of the input signal bus and the output signal bus in a dual-sided MOS IC.

FIG. 8 is a first diagram 800 conceptually illustrating a frontside (top) view of one configuration of the input signal bus 806 and the output signal bus 808 in a dual-sided MOS IC. FIG. 8 provides an example in which the MOS transistor has symmetry about a center of the MOS transistor. As illustrated in FIG. 8, the MOS IC has a symmetric source/drain connection layout about the imaginary plane 804, with the source connection 810 in the first subsection 820 and the drain connection 814 in the second subsection 822 on the MOS IC frontside, and the source connection 812 in the second subsection 822 and the drain connection 816 in the first subsection 820 on the MOS IC backside. The input signal bus 806 may be on one of the MOS IC frontside or the MOS IC backside, and the output signal bus 808 may be on the other of the MOS IC frontside or the MOS IC backside. For example, in a first configuration (as illustrated), the input signal bus 806 may be on the MOS IC frontside, and the output signal bus 808 may be on the MOS IC backside. For another example, in a second configuration, the input signal bus 806 may be on the MOS IC backside, and the output signal bus 808 may be on the MOS IC frontside.

As illustrated in FIG. 8, the input signal bus 806 is coupled to the source connection 810 on the MOS IC frontside in the first subsection 820, and the output signal bus 808 is coupled to the drain connection 816 on the MOS IC backside in the first subsection 820. The source connections 810, 812 are electrically coupled together through a first front-to-backside connection, and the drain connections 814, 816 are coupled together through a second front-to-backside connection. As discussed above, the first and second front-to-backside connections may be approximately symmetric about the imaginary plane 804.

As discussed above, each source/drain connection includes a stack of interconnects. Each stack of interconnects includes a plurality of metal x ($M_x$) layer interconnects. In one example, x=1 and therefore each stack of interconnects includes a plurality of $M_1/BM_1$ layer interconnects. Each stack of interconnects may further include a plurality of metal x+y ($M_{x+y}$) layer interconnects, where y≥1. In one example, y=1 and therefore each stack of interconnects includes a plurality of $M_1/BM_1$ layer interconnects and $M_2/BM_2$ layer interconnects. The input signal bus 806 and the output signal bus 808 extend on a higher layer than the source/drain connections. Specifically, the input signal bus 806 and the output signal bus 808 extend on a metal x+y+z ($M_{x+y+z}$) layer, where z≥1. In one example, z=1 and therefore each input/output signal bus 806, 808 may extend on an $M_3$ layer.

Figure 9:
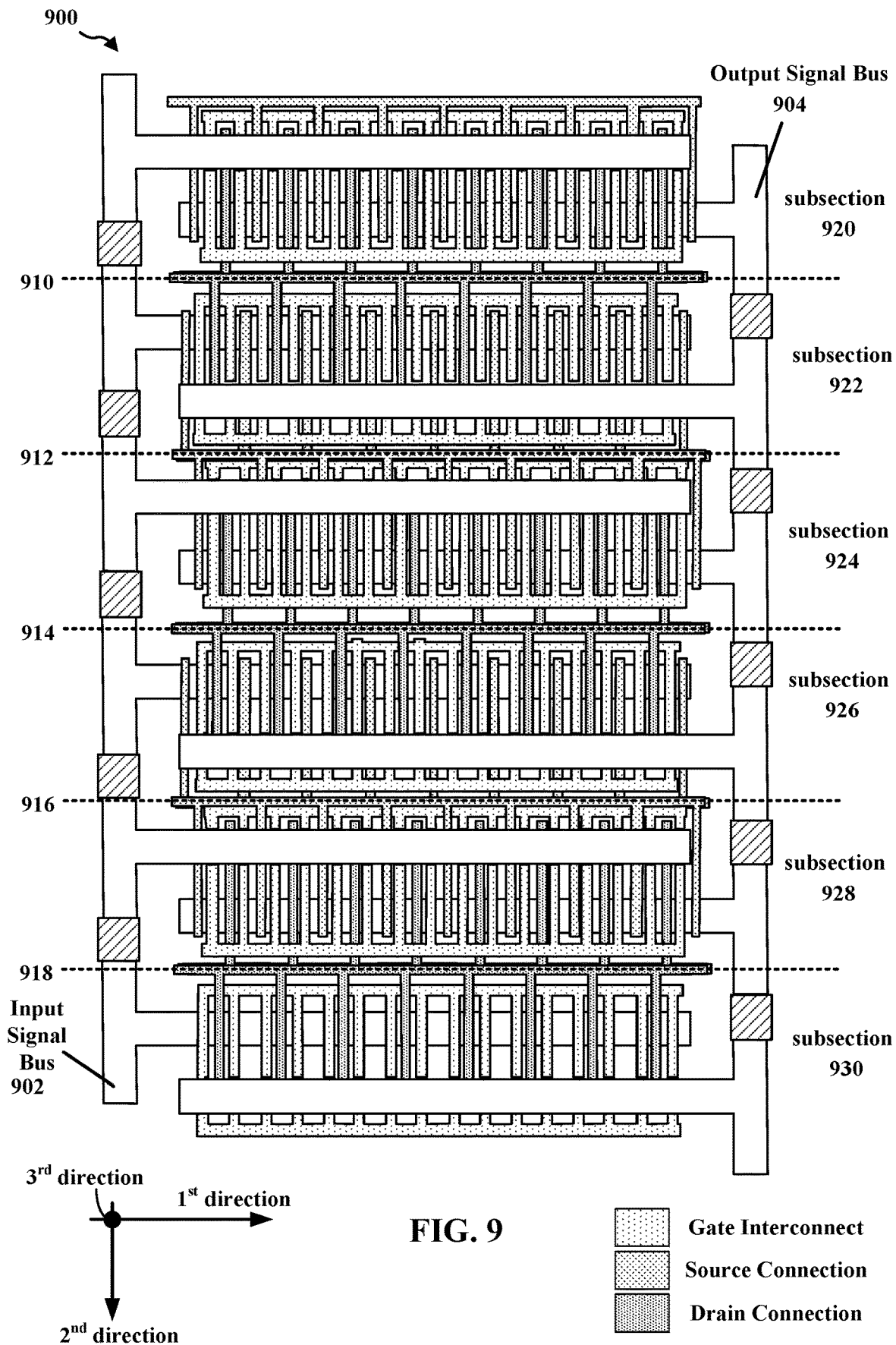
FIG. 9 is a second diagram conceptually illustrating a frontside (top) view of one configuration of the input signal bus and the output signal bus in a dual-sided MOS IC.

FIG. 9 is a second diagram 900 conceptually illustrating a frontside (top) view of one configuration of the input signal bus 902 and the output signal bus 904 in a dual-sided MOS IC. FIG. 9 provides an example in which the MOS transistor has interleaved symmetry. As illustrated in FIG. 9, imaginary planes of symmetry (rotational and/or reflection) are at 910, 912, 914, 916, 918; the source connections are on a MOS IC frontside in subsections 920, 924, 928 and on a MOS IC backside in subsections 922, 926, 930; and the drain connections are on a MOS IC backside in subsections 920, 924, 928 and on a MOS IC frontside in subsections 922, 926, 930. The input signal bus 902 extends alternately on the MOS IC frontside and the MOS IC backside, where the input signal bus 902 is coupled to the source connections in the subsections 920, 922, 924, 926, 928, 930. The output signal bus 904 also extends alternately on the MOS IC frontside and the MOS IC backside, where the output signal bus 904 is coupled to the drain connections in the subsections 920, 922, 924, 926, 928, 930. The source connections are electrically coupled together through respective front-to-backside connections (i.e., five front-to-backside connections), and the drain connections are coupled together through respective front-to-backside connections (i.e., five front-to-backside connections).

As discussed above, each source/drain connection includes a stack of interconnects. Each stack of interconnects includes a plurality of $M_x$ layer interconnects. In one example, x=1 and therefore each stack of interconnects includes a plurality of $M_1/BM_1$ layer interconnects. Each stack of interconnects may further include a plurality of $M_{x+y}$ layer interconnects, where y≥1. In one example, y=1 and therefore each stack of interconnects includes a plurality of $M_1/BM_1$ layer interconnects and $M_2/BM_2$ layer interconnects. The input signal bus 902 and the output signal bus 904 extend on a higher layer than the source/drain connections. Specifically, the input signal bus 902 and the output signal bus 904 extend on an $M_{x+y+z}$ layer, where z≥1. In one example, z=1 and therefore each input/output signal bus 902, 904 may extend on an $M_3$ layer.

As discussed above, the source/drain connection stacks and the front-to-backside connections may be symmetric. In addition, the input/output signal busses that extend alternately on the MOS IC frontside and the MOS IC backside may also be symmetric, which may further reduce the parasitic capacitance imbalances in the dual-sided transistor layout, resulting in a reduction in the second-order harmonics of the dual-sided MOS IC RF front-end switch.

Figure 10:
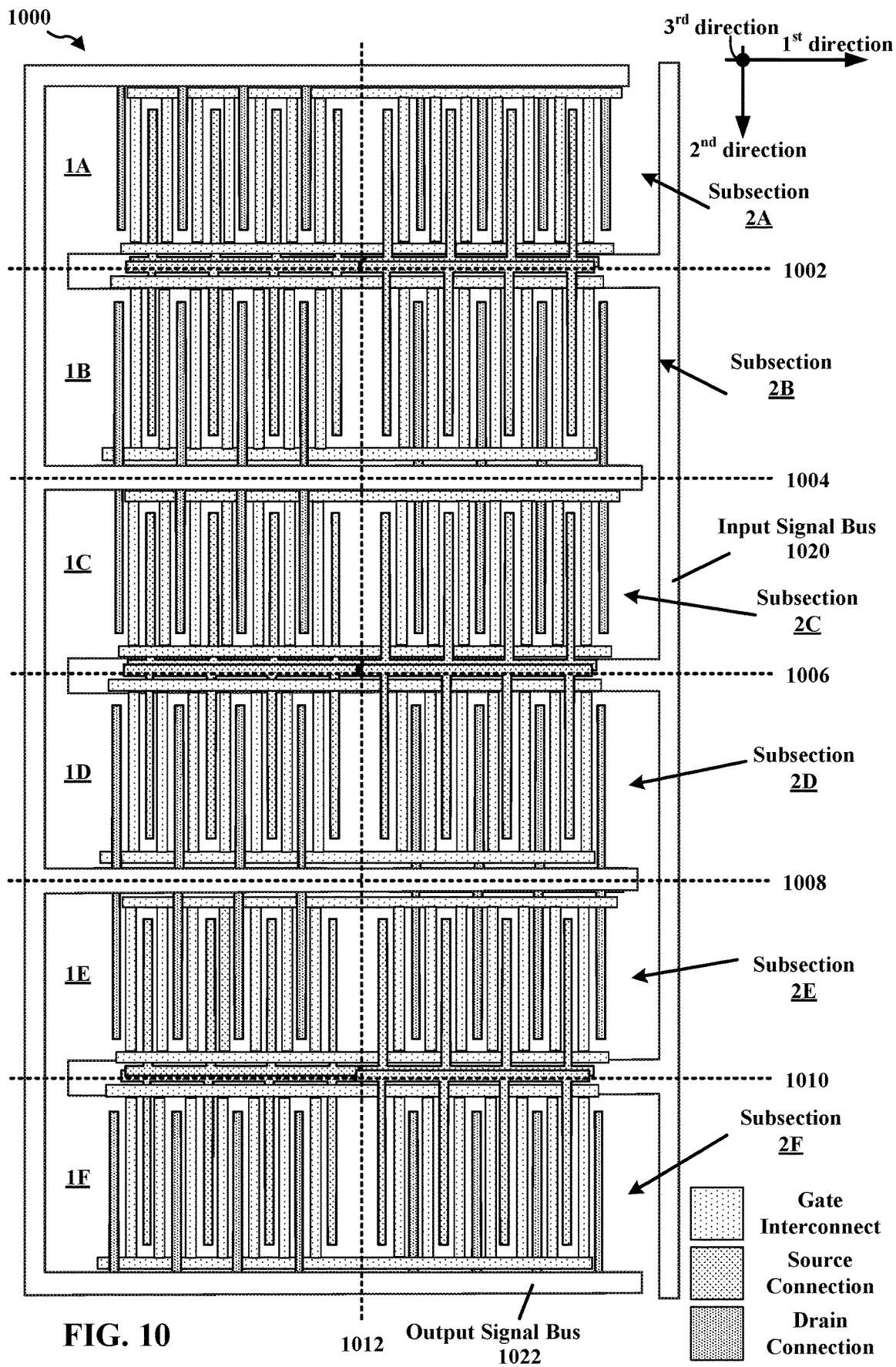
FIG. 10 is a third diagram conceptually illustrating a frontside (top) view of one configuration of the input signal bus and output signal bus in a dual-sided MOS IC.

FIG. 10 is a third diagram 1000 conceptually illustrating a frontside (top) view of one configuration of the input signal bus 1020 and output signal bus 1022 in a dual-sided MOS IC. FIG. 10 provides an example in which the MOS transistor has bidirectional symmetry. As illustrated in FIG. 10, imaginary planes of symmetry (rotational and/or reflection) are at 1002, 1004, 1006, 1008, 1010, 1012; the source connection fingers are on a MOS IC frontside in subsection 2 (i.e., subsections 2A, 2B, 2C, 2D, 2E, 2F), and on a MOS IC backside in subsection 1 (i.e., subsections 1A, 1B, 1C, 1D, 1E, 1F); and the drain connection fingers are on a MOS IC frontside in subsection 1 (i.e., subsections 1A, 1B, 1C, 1D, 1E, 1F) and on a MOS IC backside in subsection 2 (i.e., subsections 2A, 2B, 2C, 2D, 2E, 2F). In this configuration, both the source connection stack and the drain connection stack extend on both the MOS IC frontside and the MOS IC backside. In this configuration, the front-to-backside connections for coupling the source connections on the MOS IC frontside to the MOS IC backside are the source connection stacks, and the front-to-backside connections for coupling the drain connections on the MOS IC frontside to the MOS IC backside are the drain connection stacks. In one example, the source connection stack includes $M_1$ layer interconnects and $M_2$ layer interconnects on the MOS IC frontside, and $BM_1$ layer interconnects and $BM_2$ layer interconnects on the MOS IC backside, where the interconnects are coupled together with contacts/vias and are coupled to a first side of a diffusion region. Further, in the example, the drain connection stacks include $M_1$ layer interconnects and $M_2$ layer interconnects on the MOS IC frontside, and $BM_1$ layer interconnects and $BM_2$ layer interconnects on the MOS IC backside, where the interconnects are coupled together with contacts/vias and are coupled to a second side of the diffusion region. In this configuration as well as all of the previous configurations, the drain/source connections may be reversed, and therefore the connections labeled as source connections may operate as drain connections, and the connections labeled as drain connections may operate as source connections.

The input signal bus 1020 is illustrated extending over the source connection stack on the MOS IC backside, where the input signal bus 1020 is coupled to the source connection stack at the intersections of the subsection A, B, the subsection C, D, and the subsection E, F. The output signal bus 1022 is illustrated extending over the drain connection stack on the MOS IC frontside, where the output signal bus 1022 is coupled to the drain connection stack at subsection A and subsection F, and at the intersections of the subsection B, C and the subsection D, E. The input/output signal busses 1020, 1022 are on a higher metal layer, such as for example an $M_3$ layer or higher.

Figure 11:
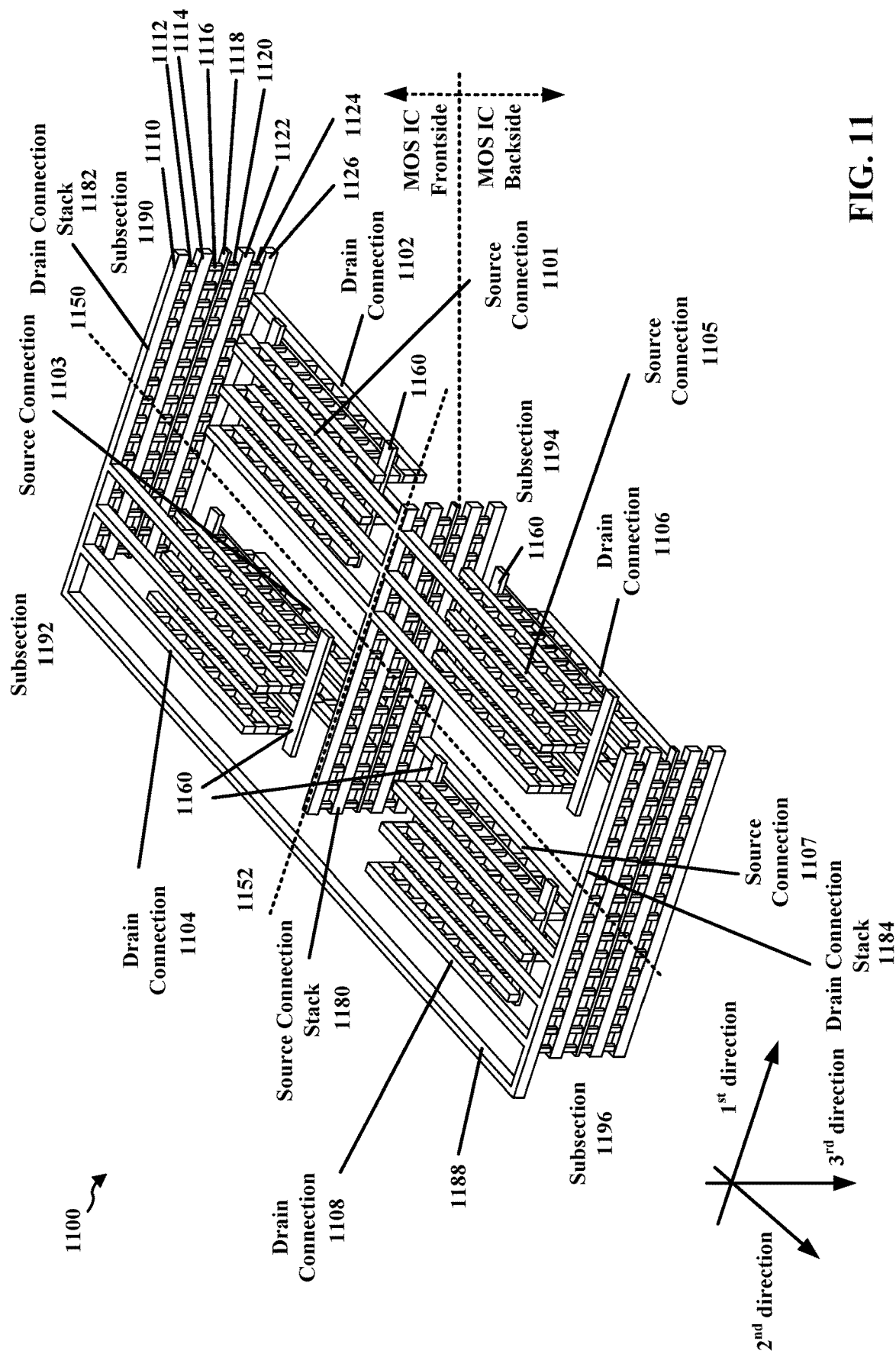
FIG. 11 is a diagram conceptually illustrating a three-dimensional view of the source connections and the drain connections of a portion of the layout structure of FIG. 10.
Figure 12:
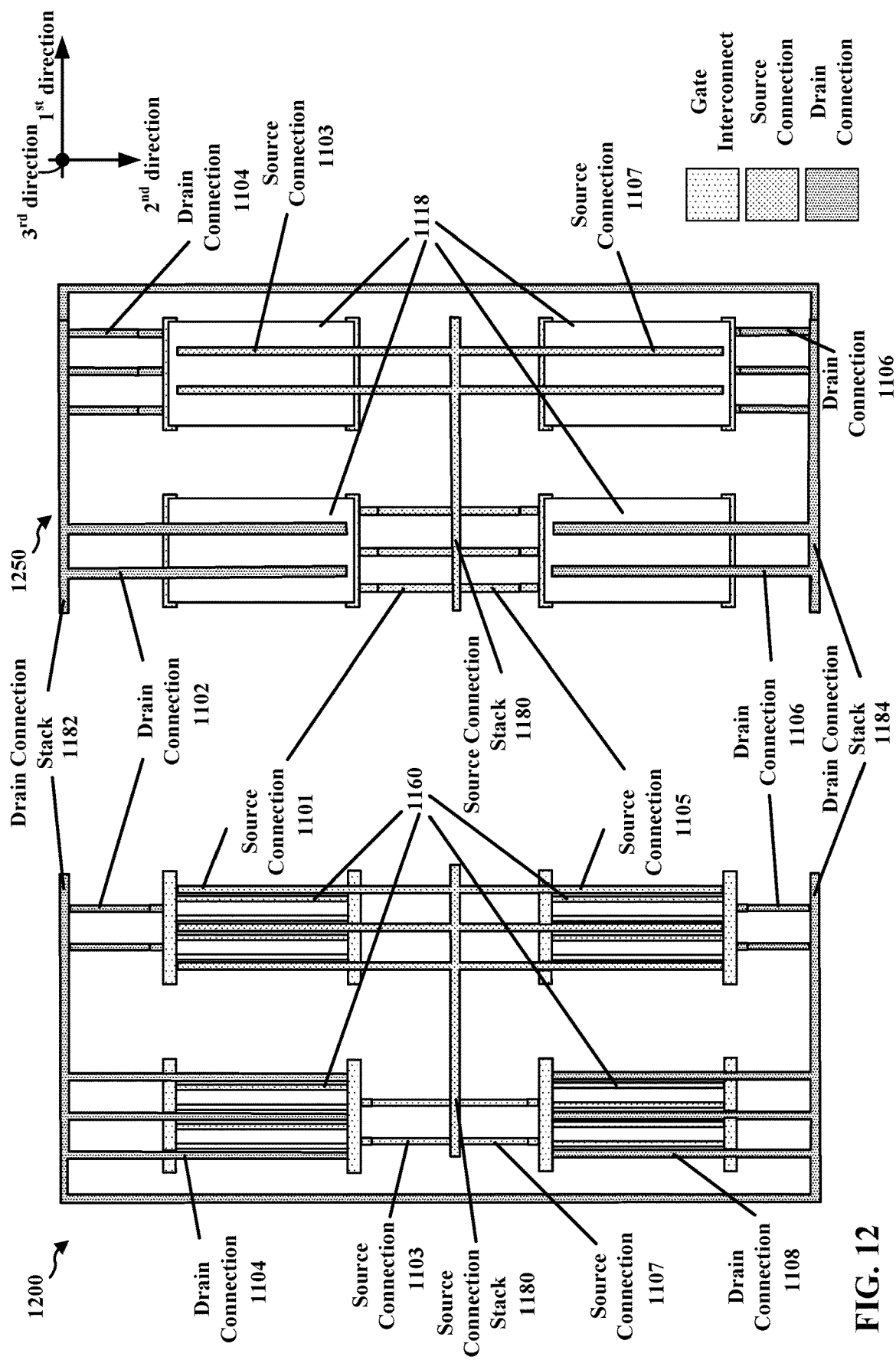
FIG. 12 is a diagram conceptually illustrating frontside (top) and backside (bottom) views of the source connections and the drain connections of a portion of the layout structure of FIG. 10.

FIG. 11 is a diagram 1100 conceptually illustrating a three-dimensional view of the source connections 1104 and the drain connections 1102 of a portion of the layout structure of FIG. 10, but with less fingers. FIG. 12 are diagrams 1200, 1250 conceptually illustrating frontside (top) and backside (bottom) views of the source connections 1104 and the drain connections 1102 of the layout structure of FIG. 11. A dual-sided MOS IC includes an isolation layer (illustrated at 502 of FIG. 5) right below the diffusion region layer 1118. The isolation layer extends in a first direction and a second direction and separates the MOS IC into a MOS IC frontside and a MOS IC backside. The MOS IC has a first subsection 1190 and a second subsection 1192 adjacent to each other in the first direction. The first subsection 1190 and the second subsection 1192 are separated at an imaginary plane 1150 extending in the second direction and a third direction through the MOS IC, where the first direction, the second direction, and the third direction are each orthogonal to each other. The dual-sided MOS IC further includes a MOS transistor on both the MOS IC frontside and the MOS IC backside. The MOS transistor includes a plurality of MOS gates 1160 extending in the second direction. The MOS transistor further includes a first source connection 1101 extending parallel to the MOS gates 1160 and to the isolation layer in the first subsection 1190 of the MOS IC frontside. The MOS transistor further includes a second source connection 1103 extending parallel to the MOS gates 1160 and to the isolation layer in the second subsection 1192 of the MOS IC backside. The first and second source connections 1101, 1103 are electrically coupled together through a first front-to-backside connection 1180 (source connection stack) extending in the third direction through the isolation layer. The MOS transistor further includes a first drain connection 1102 extending parallel to the MOS gates 1160 and to the isolation layer in the first subsection 1190 of the MOS IC backside. The MOS transistor further includes a second drain connection 1104 extending parallel to the MOS gates 1160 and to the isolation layer in the second subsection 1192 of the MOS IC frontside. The first and second drain connections 1102, 1104 are electrically coupled together through a second front-to-backside connection 1182 (drain connection stack) extending in the third direction through the isolation layer.

The MOS IC has a third subsection 1194 and a fourth subsection 1196 adjacent to each other in the first direction. The third subsection 1194 and the fourth subsection 1196 are separated at the imaginary plane 1150. The first subsection 1190 and the third subsection 1194 are adjacent to each other in the second direction. The second subsection 1192 and the fourth subsection 1196 are adjacent to each other in the second direction. The first subsection 1190 and the third subsection 1194 are separated at a second imaginary plane 1152 extending in the first direction and the third direction through the MOS IC. The second subsection 1192 and the fourth subsection 1196 are separated at the second imaginary plane 1152. The MOS transistor further includes a third source connection 1105 extending parallel to the MOS gates 1160 and to the isolation layer in the third subsection 1194 of the MOS IC frontside. The MOS transistor further includes a fourth source connection 1107 extending parallel to the MOS gates 1160 and to the isolation layer in the fourth subsection 1196 of the MOS IC backside. The third and fourth source connections 1105, 1107 are electrically coupled together through a third front-to-backside connection 1180 (source connection stack) extending in the third direction through the isolation layer. The third and fourth source connections 1105, 1107 are coupled to the first and second source connections 1101, 1103 at the source connection stack 1180. The MOS transistor further includes a third drain connection 1106 extending parallel to the MOS gates 1160 and to the isolation layer in the third subsection 1194 of the MOS IC backside. The MOS transistor further includes a fourth drain connection 1108 extending parallel to the MOS gates 1160 and to the isolation layer in the fourth subsection 1196 of the MOS IC frontside. The third and fourth drain connections 1106, 1108 are electrically coupled together through a fourth front-to-backside connection 1184 (drain connection stack) extending in the third direction through the isolation layer. The third and fourth drain connections 1106, 1108 are coupled to the first and second drain connections 1102, 1104 through the $M_2$ layer interconnect 1188.

As illustrated in FIG. 11, the first front-to-backside connection and the third front-to-backside connection are the same front-to-backside connection 1180 (source connection stack). The third and fourth source connections 1105, 1107 are coupled to the first and second source connections 1101, 1103 at the same front-to-backside connection 1180. The second front-to-backside connection 1182 and the fourth front-to-backside connection 1184 are different front-to-backside connections coupled together through the $M_2$ layer interconnect 1188. If the drain/source is swapped, then the first front-to-backside connection and the third front-to-backside connection would be different front-to-backside connections coupled together, the second front-to-backside connection and the fourth front-to-backside connection would be the same front-to-backside connection, and the third and fourth drain connections would be coupled to the first and second drain connections at the same front-to-backside connection.

As illustrated in FIG. 11, the first source connection 1101 and the second drain connection 1104 are approximately symmetric (through reflection/rotation) to each other with respect to the imaginary plane 1150. The first drain connection 1102 and the second source connection 1103 are approximately symmetric (through reflection/rotation) to each other with respect to the imaginary plane 1150. The third source connection 1105 and the fourth drain connection 1108 are approximately symmetric (through reflection/rotation) to each other with respect to the imaginary plane 1150. The third drain connection 1106 and the fourth source connection 1107 are approximately symmetric (through reflection/rotation) to each other with respect to the imaginary plane 1150. The first source connection 1101 and the third source connection 1105 are approximately symmetric (through reflection) to each other with respect to the second imaginary plane 1152. The first drain connection 1102 and the third drain connection 1106 are approximately symmetric (through reflection) to each other with respect to the second imaginary plane 1152. The second source connection 1103 and the fourth source connection 1107 (through reflection) are approximately symmetric to each other with respect to the second imaginary plane 1150. The second drain connection 1104 and the fourth drain connection 1108 are approximately symmetric (through reflection) to each other with respect to the second imaginary plane 1150.

Referring to FIGS. 10, 11, the dual-sided MOS IC may further include a first signal bus (input signal bus) 1020 on one of the MOS IC frontside or the MOS IC backside. As illustrated in FIG. 10, the first signal bus (input signal bus) 1020 is on the MOS IC backside. When the first signal bus (input signal bus) 1020 is on the MOS IC frontside, the first signal bus (input signal bus) 1020 would be coupled directly to the first source connection and the second source connection, and when the first signal bus (input signal bus) 1020 is on the MOS IC backside, the first signal bus (input signal bus) 1020 would be coupled directly to the third source connection and the fourth source connection. As illustrated in FIGS. 10, 11, the first signal bus (input signal bus) 1020 is on the MOS IC backside, and is coupled directly to the third source connection and the fourth source connection. The first signal bus (input signal bus) 1020 is also coupled to the first and third source connections through the source connection stack (front-to-backside connection) 1180.

The dual-sided MOS IC may further include a second signal bus (output signal bus) 1022 on the other one of the MOS IC frontside or the MOS IC backside. As illustrated in FIG. 10, the second signal bus (output signal bus) 1022 is on the MOS IC frontside. When the second signal bus (output signal bus) 1022 is on the MOS IC frontside, the second signal bus (output signal bus) 1022 would be coupled to the second drain connection and the fourth drain connection, and when the second signal bus (output signal bus) 1022 is on the MOS IC backside, the second signal bus (output signal bus) 1022 would be coupled to the first drain connection and the third drain connection. As illustrated in FIGS. 10, 11, the second signal bus (output signal bus) 1022 is on the MOS IC frontside, and is coupled directly to the second drain connection and the fourth source connection. The second signal bus (output signal bus) 1022 is also coupled to the first and third drain connections through the drain connection stacks (front-to-backside connections) 1182, 1184.

Each source/drain connection includes a stack of interconnects. Each stack of interconnects includes a plurality of $M_x$ layer interconnects 1114/1122. In one example, x=1 and therefore each stack of interconnects includes a plurality of $M_1/BM_1$ layer interconnects 1114/1122. Each stack of interconnects may further include a plurality of metal x+y ($M_{x+y}$) layer interconnects 1110/1126, where y≥1. In one example, y=1 and therefore each stack of interconnects includes a plurality of $M_1/BM_1$ layer interconnects 1114/1122 and $M_2/BM_2$ layer interconnects 1110/1126. The $M_1/BM_1$ layer interconnects 1114/1122 and the $M_2/BM_2$ layer interconnects 1110/1126 are coupled together through vias $V_1/BV_1$ 1112/1124 (see also via $V_1$ 116 of FIG. 1). The stack of interconnects further includes contacts/vias 1116/1120 (see also contacts/vias 110, 112 of FIG. 1) that couple the $M_1/BM_1$ layer interconnects to the diffusion region layer 1118. The input signal bus 1020 and the output signal bus 1022 extend on a higher layer than the source/drain connections. Specifically, the input signal bus 1020 and the output signal bus 1022 extend on metal x+y+z ($M_{x+y+z}$) layer, where z≥1. In one example, z=1 and therefore each input/output signal bus 1020, 1022 may extend on an $M_3$ layer.

As discussed above, the dual-sided MOS IC layout for the RF front-end switch decreases $C_{off}$, but increases second-order harmonics due to inherent asymmetries in the source/drain connection layout configuration. Different layout configurations of a dual-sided MOS IC are provided that have reflectional and/or rotational symmetry in order to balance parasitic capacitances, such as $C_{sg}$ and $C_{dg}$. Specifically, various configurations of approximately symmetric (reflectional and/or rotational) source/drain connection stacks, front-to-backside connections, and input/output busses of a dual-sided MOS IC RF front-end switch are provided that balance the parasitic capacitances of the dual-sided layout, resulting in a reduction in the second-order harmonics of the dual-sided MOS IC RF front-end switch.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Aspect 1 is a dual-sided MOS IC including an isolation layer and a MOS transistor. The isolation layer extends in a first direction and a second direction and separates the MOS IC into a MOS IC frontside and a MOS IC backside. The MOS IC has a first subsection and a second subsection adjacent to each other in the first direction. The first subsection and the second subsection are separated at an imaginary plane extending in the second direction and a third direction through the MOS IC, where the first direction, the second direction, and the third direction are each orthogonal to each other. The MOS transistor is on both the MOS IC frontside and the MOS IC backside. The MOS transistor includes a plurality of MOS gates extending in the second direction, a first source connection extending parallel to the MOS gates and to the isolation layer in the first subsection of the MOS IC frontside, and a second source connection extending parallel to the MOS gates and to the isolation layer in the second subsection of the MOS IC backside. The first and second source connections are electrically coupled together through a first front-to-backside connection extending in the third direction through the isolation layer. The MOS transistor further includes a first drain connection extending parallel to the MOS gates and to the isolation layer in the first subsection of the MOS IC backside, and a second drain connection extending parallel to the MOS gates and to the isolation layer in the second subsection of the MOS IC frontside. The first and second drain connections are electrically coupled together through a second front-to-backside connection extending in the third direction through the isolation layer.

Aspect 2 is the dual-sided MOS IC of aspect 1, wherein the first source connection, the second source connection, the first drain connection, and the second drain connection each include a plurality of fingers extending in the second direction.

Aspect 3 is the dual-sided MOS IC of any of aspects 1 and 2, wherein the first front-to-backside connection and the second front-to-backside connection are offset from the imaginary plane.

Aspect 4 is the dual-sided MOS IC of any of aspects 1 and 2, wherein the first front-to-backside connection and the second front-to-backside connection are approximately aligned with the imaginary plane.

Aspect 5 is the dual-sided MOS IC of any of aspects 1 to 4, wherein the first front-to-backside connection and the second front-to-backside connection are approximately symmetric to each other with respect to the imaginary plane.

Aspect 6 is the dual-sided MOS IC of any of aspects 1 to 5, wherein the first source connection and the second drain connection are approximately symmetric to each other with respect to the imaginary plane, and the first drain connection and the second source connection are approximately symmetric to each other with respect to the imaginary plane.

Aspect 7 is the dual-sided MOS IC of any of aspects 1 to 6, wherein the MOS IC has a third subsection adjacent to the first subsection in the first direction. The first subsection and the third subsection are separated at a second imaginary plane extending in the second direction and the third direction through the MOS IC. Wherein the MOS transistor further includes a third drain connection extending parallel to the MOS gates and to the isolation layer in the third subsection of the MOS IC frontside. The first and third drain connections are electrically coupled together through a third front-to-backside connection extending in the third direction through the isolation layer. The MOS transistor further includes a third source connection extending parallel to the MOS gates and to the isolation layer in the third subsection of the MOS IC backside. The first and third source connections are electrically coupled together through a fourth front-to-backside connection extending in the third direction through the isolation layer.

Aspect 8 is the dual-sided MOS IC of aspect 7, wherein the first source connection and the third drain connection are approximately symmetric to each other with respect to the second imaginary plane, and the first drain connection and the third source connection are approximately symmetric to each other with respect to the second imaginary plane.

Aspect 9 is the dual-sided MOS IC of any of aspects 1 to 8, wherein the MOS IC has a third subsection adjacent to the second subsection in the first direction. The second subsection and the third subsection are separated at a second imaginary plane extending in the second direction and the third direction through the MOS IC. Wherein the MOS transistor further includes a third source connection extending parallel to the MOS gates and to the isolation layer in the third subsection of the MOS IC frontside. The second and third source connections are electrically coupled together through a third front-to-backside connection extending in the third direction through the isolation layer. The MOS transistor further includes a third drain connection extending parallel to the MOS gates and to the isolation layer in the third subsection of the MOS IC backside. The second and third drain connections are electrically coupled together through a fourth front-to-backside connection extending in the third direction through the isolation layer.

Aspect 10 is the dual-sided MOS IC of aspect 9, wherein the second source connection and the third drain connection are approximately symmetric to each other with respect to the second imaginary plane, and the second drain connection and the third source connection are approximately symmetric to each other with respect to the second imaginary plane.

Aspect 11 is the dual-sided MOS IC of any of aspects 1 to 10, further including: a first signal bus on one of the MOS IC frontside or the MOS IC backside, the first signal bus being coupled to one of the first source connection or the second source connection; and a second signal bus on an other one of the MOS IC frontside or the MOS IC backside, the second signal bus being coupled to one of the first drain connection or the second drain connection.

Aspect 12 is the dual-sided MOS IC of any of aspects 1 to 11, further including: a first signal bus extending alternately on the MOS IC frontside and the MOS IC backside, the first signal bus being coupled to both the first source connection and the second source connection; and a second signal bus extending alternately on the MOS IC frontside and the MOS IC backside, the second signal bus being interleaved with the first signal bus on both the MOS IC frontside and the MOS IC backside, the second signal bus being coupled to both the first drain connection and the second drain connection.

Aspect 13 is the dual-sided MOS IC of aspect 12, wherein the first signal bus extends on a higher layer than the first source connection on the MOS IC frontside and the second source connection on the MOS IC backside, and the second signal bus extends on a higher layer than the first drain connection on the MOS IC backside and the second drain connection on the MOS IC frontside.

Aspect 14 is the dual-sided MOS IC of any of aspects 1 to 13, wherein the MOS IC has a third subsection and a fourth subsection adjacent to each other in the first direction. The third subsection and the fourth subsection are separated at the imaginary plane. The first subsection and the third subsection are adjacent to each other in the second direction. The second subsection and the fourth subsection are adjacent to each other in the second direction. The first subsection and the third subsection are separated at a second imaginary plane extending in the first direction and the third direction through the MOS IC. The second subsection and the fourth subsection are separated at the second imaginary plane. Wherein the MOS transistor further includes a third source connection extending parallel to the MOS gates and to the isolation layer in the third subsection of the MOS IC frontside; a fourth source connection extending parallel to the MOS gates and to the isolation layer in the fourth subsection of the MOS IC backside, the third and fourth source connections being electrically coupled together through a third front-to-backside connection extending in the third direction through the isolation layer, the third and fourth source connections being coupled to the first and second source connections; a third drain connection extending parallel to the MOS gates and to the isolation layer in the third subsection of the MOS IC backside; and a fourth drain connection extending parallel to the MOS gates and to the isolation layer in the fourth subsection of the MOS IC frontside, the third and fourth drain connections being electrically coupled together through a fourth front-to-backside connection extending in the third direction through the isolation layer, the third and fourth drain connections being coupled to the first and second drain connections.

Aspect 15 is the dual-sided MOS IC of aspect 14, wherein the first front-to-backside connection and the third front-to-backside connection are a same front-to-backside connection, the third and fourth source connections are coupled to the first and second source connections at the same front-to-backside connection, and the second front-to-backside connection and the fourth front-to-backside connection are different front-to-backside connections coupled together.

Aspect 16 is the dual-sided MOS IC of aspect 14, wherein the first front-to-backside connection and the third front-to-backside connection are different front-to-backside connections coupled together, the second front-to-backside connection and the fourth front-to-backside connection are a same front-to-backside connection, and the third and fourth drain connections are coupled to the first and second drain connections at the same front-to-backside connection.

Aspect 17 is the dual-sided MOS IC of any of aspects 14 to 16, wherein the first source connection and the second drain connection are approximately symmetric to each other with respect to the imaginary plane, the first drain connection and the second source connection are approximately symmetric to each other with respect to the imaginary plane, the third source connection and the fourth drain connection are approximately symmetric to each other with respect to the imaginary plane, the third drain connection and the fourth source connection are approximately symmetric to each other with respect to the imaginary plane, the first source connection and the third source connection are approximately symmetric to each other with respect to the second imaginary plane, the first drain connection and the third drain connection are approximately symmetric to each other with respect to the second imaginary plane, the second source connection and the fourth source connection are approximately symmetric to each other with respect to the second imaginary plane, the second drain connection and the fourth drain connection are approximately symmetric to each other with respect to the second imaginary plane.

Aspect 18 is the dual-sided MOS IC of any of aspects 14 to 17, further comprising: a first signal bus on one of the MOS IC frontside or the MOS IC backside, the first signal bus being coupled to one of the first source connection and the third source connection, or the second source connection and the fourth source connection; and a second signal bus on an other one of the MOS IC frontside or the MOS IC backside, the second signal bus being coupled to one of the second drain connection and the fourth drain connection, or the first drain connection and the third drain connection.

Aspect 19 is the dual-sided MOS IC of any of aspects 1 to 18, wherein the isolation layer is a BOX layer.

Aspect 20 is the dual-sided MOS IC of any of aspects 1 to 19, wherein the first front-to-backside connection and the second front-to-backside connection each include at least one via.

Aspect 21 is the dual-sided MOS IC of any of aspects 1 to 20, wherein the first source connection is coupled to a first source diffusion region on the MOS IC frontside, the first drain connection is coupled to a first drain diffusion region on the MOS IC frontside, the second drain connection is coupled to a second drain diffusion region on the MOS IC frontside, and the second source connection is coupled to a second source diffusion region on the MOS IC frontside.

Aspect 22 is the dual-sided MOS IC of aspect 21, wherein the first source diffusion region and the first drain diffusion region share a first continuous diffusion region, and the second source diffusion region and the second drain diffusion region share a second continuous diffusion region, where the first continuous diffusion region and the second continuous diffusion region are separate from each other.

Aspect 23 is the dual-sided MOS IC of any of aspects 1 to 22, wherein the first source connection includes at least a first plurality of $M_x$ layer interconnects, the first drain connection includes at least a second plurality of $M_x$ layer interconnects, the second source connection includes at least a third plurality of $M_x$ layer interconnects, and the second drain connection includes at least a fourth plurality of $M_x$ layer interconnects.

Aspect 24 is the dual-sided MOS IC of any of aspects 1 to 23, wherein the first source connection further includes a first plurality of $M_{x+y}$ layer interconnects coupled to the first plurality of $M_x$ layer interconnects, the first drain connection further includes a second plurality of $M_{x+y}$ layer interconnects coupled to the second plurality of $M_x$ layer interconnects, the second source connection further includes a third plurality of $M_{x+y}$ layer interconnects coupled to the third plurality of $M_x$ layer interconnects, and the second drain connection further includes a fourth plurality of $M_{x+y}$ layer interconnects coupled to the fourth plurality of $M_x$ layer interconnects.

Aspect 25 is the dual-sided MOS IC of any of aspects 1 to 24, wherein the MOS gates, the first source connection, the second source connection, the first drain connection, the second drain connection, the first front-to-backside connection, and the second front-to-backside connection have a rotational symmetry.

Aspect 26 is the dual-sided MOS IC of any of aspects 1 to 25, wherein the MOS transistor is configured to be an RF switch.

What is claimed is:

1. A dual-sided metal oxide semiconductor (MOS) integrated circuit (IC), comprising:
    an isolation layer extending in a first direction and a second direction and separating the MOS IC into a MOS IC frontside and a MOS IC backside, the MOS IC having a first subsection and a second subsection adjacent to each other in the first direction, the first subsection and the second subsection being separated at an imaginary plane extending in the second direction and a third direction through the MOS IC, where the first direction, the second direction, and the third direction are each orthogonal to each other; and
    a MOS transistor on the MOS IC, the MOS transistor comprising:
        a plurality of MOS gates extending in the second direction;
        a first source connection extending parallel to the MOS gates and to the isolation layer in the first subsection of the MOS IC frontside;
        a second source connection extending parallel to the MOS gates and to the isolation layer in the second subsection of the MOS IC backside, the first and second source connections being electrically coupled together through a first front-to-backside connection extending in the third direction through the isolation layer;
        a first drain connection extending parallel to the MOS gates and to the isolation layer in the first subsection of the MOS IC backside; and
        a second drain connection extending parallel to the MOS gates and to the isolation layer in the second subsection of the MOS IC frontside, the first and second drain connections being electrically coupled together through a second front-to-backside connection extending in the third direction through the isolation layer.

2. The dual-sided MOS IC of claim 1, wherein the first source connection, the second source connection, the first drain connection, and the second drain connection each comprise a plurality of fingers extending in the second direction.

3. The dual-sided MOS IC of claim 1, wherein the first front-to-backside connection and the second front-to-backside connection are offset from the imaginary plane.

4. The dual-sided MOS IC of claim 1, wherein the first front-to-backside connection and the second front-to-backside connection are approximately aligned with the imaginary plane.

5. The dual-sided MOS IC of claim 1, wherein the first front-to-backside connection and the second front-to-backside connection are approximately symmetric to each other with respect to the imaginary plane.

6. The dual-sided MOS IC of claim 1, wherein the first source connection and the second drain connection are approximately symmetric to each other with respect to the imaginary plane, and the first drain connection and the second source connection are approximately symmetric to each other with respect to the imaginary plane.

7. The dual-sided MOS IC of claim 1, wherein the MOS IC has a third subsection adjacent to the first subsection in the first direction, the first subsection and the third subsection being separated at a second imaginary plane extending in the second direction and the third direction through the MOS IC, and wherein the MOS transistor further comprises:
    a third drain connection extending parallel to the MOS gates and to the isolation layer in the third subsection of the MOS IC frontside, the first and third drain connections being electrically coupled together through a third front-to-backside connection extending in the third direction through the isolation layer; and
    a third source connection extending parallel to the MOS gates and to the isolation layer in the third subsection of the MOS IC backside, the first and third source connections being electrically coupled together through a fourth front-to-backside connection extending in the third direction through the isolation layer.

8. The dual-sided MOS IC of claim 7, wherein the first source connection and the third drain connection are approximately symmetric to each other with respect to the second imaginary plane, and the first drain connection and the third source connection are approximately symmetric to each other with respect to the second imaginary plane.

9. The dual-sided MOS IC of claim 1, wherein the MOS IC has a third subsection adjacent to the second subsection in the first direction, the second subsection and the third subsection being separated at a second imaginary plane extending in the second direction and the third direction through the MOS IC, and wherein the MOS transistor further comprises:
    a third source connection extending parallel to the MOS gates and to the isolation layer in the third subsection of the MOS IC frontside, the second and third source connections being electrically coupled together through a third front-to-backside connection extending in the third direction through the isolation layer; and
    a third drain connection extending parallel to the MOS gates and to the isolation layer in the third subsection of the MOS IC backside, the second and third drain connections being electrically coupled together through a fourth front-to-backside connection extending in the third direction through the isolation layer.

10. The dual-sided MOS IC of claim 9, wherein the second source connection and the third drain connection are approximately symmetric to each other with respect to the second imaginary plane, and the second drain connection and the third source connection are approximately symmetric to each other with respect to the second imaginary plane.

11. The dual-sided MOS IC of claim 1, further comprising:
    a first signal bus on one of the MOS IC frontside or the MOS IC backside, the first signal bus being coupled to one of the first source connection or the second source connection; and
    a second signal bus on an other one of the MOS IC frontside or the MOS IC backside, the second signal bus being coupled to one of the first drain connection or the second drain connection.

12. The dual-sided MOS IC of claim 1, further comprising:
    a first signal bus extending alternately on the MOS IC frontside and the MOS IC backside, the first signal bus being coupled to both the first source connection and the second source connection; and
    a second signal bus extending alternately on the MOS IC frontside and the MOS IC backside, the second signal bus being interleaved with the first signal bus on both the MOS IC frontside and the MOS IC backside, the second signal bus being coupled to both the first drain connection and the second drain connection.

13. The dual-sided MOS IC of claim 12, wherein the first signal bus extends on a higher layer than the first source connection on the MOS IC frontside and the second source connection on the MOS IC backside, and the second signal bus extends on a higher layer than the first drain connection on the MOS IC backside and the second drain connection on the MOS IC frontside.

14. The dual-sided MOS IC of claim 1, wherein the MOS IC has a third subsection and a fourth subsection adjacent to each other in the first direction, the third subsection and the fourth subsection being separated at the imaginary plane, the first subsection and the third subsection being adjacent to each other in the second direction, the second subsection and the fourth subsection being adjacent to each other in the second direction, the first subsection and the third subsection being separated at a second imaginary plane extending in the first direction and the third direction through the MOS IC, the second subsection and the fourth subsection being separated at the second imaginary plane; and wherein the MOS transistor further comprises:
a third source connection extending parallel to the MOS gates and to the isolation layer in the third subsection of the MOS IC frontside;
a fourth source connection extending parallel to the MOS gates and to the isolation layer in the fourth subsection of the MOS IC backside, the third and fourth source connections being electrically coupled together through a third front-to-backside connection extending in the third direction through the isolation layer, the third and fourth source connections being coupled to the first and second source connections;
a third drain connection extending parallel to the MOS gates and to the isolation layer in the third subsection of the MOS IC backside; and
a fourth drain connection extending parallel to the MOS gates and to the isolation layer in the fourth subsection of the MOS IC frontside, the third and fourth drain connections being electrically coupled together through a fourth front-to-backside connection extending in the third direction through the isolation layer, the third and fourth drain connections being coupled to the first and second drain connections.

15. The dual-sided MOS IC of claim 14, wherein the first front-to-backside connection and the third front-to-backside connection are a same front-to-backside connection, the third and fourth source connections are coupled to the first and second source connections at the same front-to-backside connection, and the second front-to-backside connection and the fourth front-to-backside connection are different front-to-backside connections coupled together.

16. The dual-sided MOS IC of claim 14, wherein the first front-to-backside connection and the third front-to-backside connection are different front-to-backside connections coupled together, the second front-to-backside connection and the fourth front-to-backside connection are a same front-to-backside connection, and the third and fourth drain connections are coupled to the first and second drain connections at the same front-to-backside connection.

17. The dual-sided MOS IC of claim 14, wherein the first source connection and the second drain connection are approximately symmetric to each other with respect to the imaginary plane, the first drain connection and the second source connection are approximately symmetric to each other with respect to the imaginary plane, the third source connection and the fourth drain connection are approximately symmetric to each other with respect to the imaginary plane, the third drain connection and the fourth source connection are approximately symmetric to each other with respect to the imaginary plane, the first source connection and the third source connection are approximately symmetric to each other with respect to the second imaginary plane, the first drain connection and the third drain connection are approximately symmetric to each other with respect to the second imaginary plane, the second source connection and the fourth source connection are approximately symmetric to each other with respect to the second imaginary plane, the second drain connection and the fourth drain connection are approximately symmetric to each other with respect to the second imaginary plane.

18. The dual-sided MOS IC of claim 14, further comprising:
a first signal bus on one of the MOS IC frontside or the MOS IC backside, the first signal bus being coupled to one of the first source connection and the third source connection, or the second source connection and the fourth source connection; and
a second signal bus on an other one of the MOS IC frontside or the MOS IC backside, the second signal bus being coupled to one of the second drain connection and the fourth drain connection, or the first drain connection and the third drain connection.

19. The dual-sided MOS IC of claim 1, wherein the isolation layer is a buried oxide (BOX) layer.

20. The dual-sided MOS IC of claim 1, wherein the first front-to-backside connection and the second front-to-backside connection each comprise at least one via.

21. The dual-sided MOS IC of claim 1, wherein the first source connection is coupled to a first source diffusion region on the MOS IC frontside, the first drain connection is coupled to a first drain diffusion region on the MOS IC frontside, the second drain connection is coupled to a second drain diffusion region on the MOS IC frontside, and the second source connection is coupled to a second source diffusion region on the MOS IC frontside.

22. The dual-sided MOS IC of claim 21, wherein the first source diffusion region and the first drain diffusion region share a first continuous diffusion region, and the second source diffusion region and the second drain diffusion region share a second continuous diffusion region, where the first continuous diffusion region and the second continuous diffusion region are separate from each other.

23. The dual-sided MOS IC of claim 1, wherein the first source connection comprises at least a first plurality of metal x ($M_x$) layer interconnects, the first drain connection comprises at least a second plurality of $M_x$ layer interconnects, the second source connection comprises at least a third plurality of $M_x$ layer interconnects, and the second drain connection comprises at least a fourth plurality of $M_x$ layer interconnects.

24. The dual-sided MOS IC of claim 23, wherein the first source connection further comprises a first plurality of metal x+y ($M_{x+y}$) layer interconnects coupled to the first plurality of $M_x$ layer interconnects, the first drain connection further comprises a second plurality of $M_{x+y}$ layer interconnects coupled to the second plurality of $M_x$ layer interconnects, the second source connection further comprises a third plurality of $M_{x+y}$ layer interconnects coupled to the third plurality of $M_x$ layer interconnects, and the second drain connection further comprises a fourth plurality of $M_{x+y}$ layer interconnects coupled to the fourth plurality of $M_x$ layer interconnects.

25. The dual-sided MOS IC of claim 1, wherein the MOS gates, the first source connection, the second source connection, the first drain connection, the second drain connection, the first front-to-backside connection, and the second front-to-backside connection have a rotational symmetry.

26. The dual-sided MOS IC of claim 1, wherein the MOS transistor is configured to be a radio frequency (RF) switch.

* * * * *